United States Patent [19]

Bellanger et al.

[11] 3,928,755

[45] Dec. 23, 1975

[54] LOW PASS NONRECUSINE DIGITAL FILTER

[75] Inventors: Maurice Georges Bellanger, Antony; Guy Pierre Lepagnol, Sceaux; Jacques Lucien Daguet, Saint-Maur-des-Fosses, all of France

[73] Assignee: Telecommunications Radioelectriques et Telephoniques T.R.T., Paris, France

[22] Filed: Jan. 24, 1974

[21] Appl. No.: 436,392

[30] Foreign Application Priority Data

Jan. 25, 1973 France ............................ 73.02584

[52] U.S. Cl. ................................ 235/152; 235/154

[51] Int. Cl.$^2$ ........................................ G06F 15/34

[58] Field of Search .................... 235/152, 156, 181; 328/165, 167; 325/42

[56] References Cited

UNITED STATES PATENTS 3,521,041 7/1970 Van Blerkom et al. ............ 235/156

3,732,409 5/1973 Zohar ............................ 328/167 X

OTHER PUBLICATIONS

S. A. White, "A Slow Approach to Mechanizing a Fast Digital Interpolation Filter" IEEE Trans. on Audio & Electroacoustics Mar. 1972, pp. 90–93.

*Primary Examiner*—David H. Malzahn
*Attorney, Agent, or Firm*—Frank R. Trifari; George B. Berka

[57] ABSTRACT

A digital filter having a cut-off frequency of $f_c$ to which code words of a frequency $f_s$ are applied and which supplies code words at a frequency of $f'_s$. The filter comprises a first digital filter section supplying numbers having a reduced frequency $f_m$ and whose output is directly coupled to an interpolating digital filter supplying the outgoing numbers of the filter at the frequency $f'_s$. The first filter section and the interpolating digital filter are each built up as a digital filter having a cut-off frequency of $f_m/2$.

2 Claims, 25 Drawing Figures

LOW PASS NONRECUSINE DIGITAL FILTER

The invention relates to a digital filter having a cut-off frequency $F_c$ for filtering binary coded samples of an analog information signal occurring at a first sampling frequency $f_s$ and for generating first binary code words occurring at a second sampling frequency $f'_s$ which constitute a binary coded version of samples occurring at said second sampling frequency $f'_s$ of a version filtered by the filter of said analog information signal.

The frequencies $f_s$ and $f'_s$ of the input samples and the output samples may be equal and are at least $2f_c$ in accordance with the sampling theorem.

To economically realize such a digital filter it is necessary to use the so-called large scale integration.

In such an integration technique active components are generally used such as MOS transistors which do not permit high switching rates. When making digital filters special attention is therefore to be paid to the number of calculations which must be performed per second in order to realize a given filter characteristic.

An article by F. Pellandrini published in "Proceedings of international Zurich Seminar on integrated system for Speech, video and data communications", 15–17 Mar. 1972, Zurich, Switzerland and entitled "Méthodes et Moyens pour l'élaboration de signaux analogiques" gives a survey and a comparison of the different methods hitherto in use for manufacturing digital filters. In this connection reference is also made to Gold and Radar "Digital Processing of Signals", McGraw-Hill, 1969.

The above-mentioned publication describes four known methods namely:

- direct convolution which is used in non-recursive filters. In this method a sample of the analog signal to be filtered is multiplied by a sample of the pulse response of the filter where the duration of the pulse response is limited.
- repeated convolution which is used in recursive filters. This method differs from the previous one in that a pulse response of infinite duration is simulated,
- rapid convolution. In this method use is made of the rapid Fourier transformation and the operations are preformed on samples of the spectrum of the signal to be filtered.
- frequency sampling method which is used non-recursive filter and with which a comb filter is divided into a series of resonators.

The article by Pellandrini (see tables 1, 2, 3 and FIG. 4) shows that for realizing a desired transfer characteristic with the aid of a recursive filter a considerably lower number of multiplications is necessary for each output sample to be determined than when using a non-recursive filter. This advantage of recursive filters is the greater as the filter edge is steeper. The number of required stores in the recursive filters is also much smaller. The filters which are designed in accordance with the method of rapid convolution or in accordance with the method of frequency sampling have properties deviating therefrom as regards the number of multiplications to be performed while the number of required stores is generally much higher. It is to be noted that, as is known, non-recursive filters have the advantage of not introducing phase distortions and, unlike recursive filters, they are not susceptible to instabilities.

It is an object of the invention to provide a digital filter with which a desired filter edge is realized with an optimum number of store elements and a minimum number of multiplications to be performed per unit of time.

According to the invention the filter is provided with at least a first digital filter subunit or section having a cut-off frequency $f_m/2$ to which the said binary coded samples occurring at a frequency $f_s$ are applied and which supplies second code words occurring at a frequency $f_m$ which frequency $f_m$ is at least equal to $2f_c$ and smaller than $f_s$, the output of said first section being coupled to the input of a second digital filter subunit or section in the form of an interpolating digital filter having a cut-off frequency of $f_m/2$ to which third code words are applied which occur at the said sampling frequency $f_m$ and which are related to said second code words, said interpolating digital filter supplying output code words in accordance with these third code words which output code words occur at said sampling frequency $f'_s$ which is higher than the said sampling frequency $f_m$.

The number of multiplications per second is about a factor of 5 lower than those in a non-recursive filter of the known type having the same slope as has the filter according to the invention which is realized, for example, with a first and a second digital filter section of the non-recursive type and which has, for example, a cut-off frequency $f_c$ which is equal to one tenth of half the sampling frequency $f_s$.

The invention will now be described with reference to the Figures.

Figure 1:
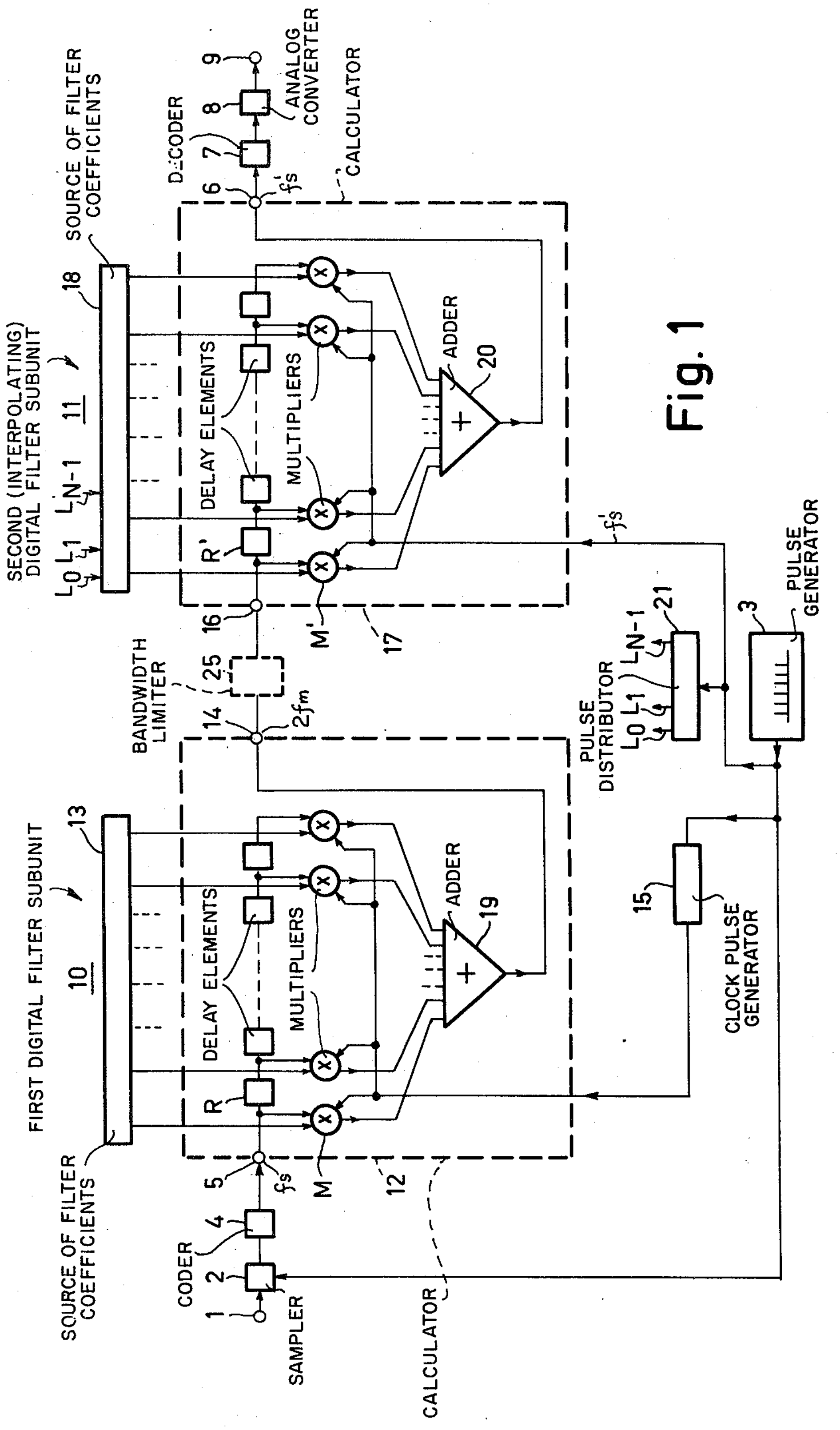
FIG. 1 shows an embodiment of the filter according to the invention.

In the embodiment shown in FIG. 1 the analog signal to be filtered is applied through an input terminal 1 to a sampler 2 which is controlled by a pulse generator 3 at the sampling frequency $f_s = 1/T$. The output samples of the sampler 2 are applied to a coder 4 which applies code words to the input 5 of the digital filter which words occur at the frequency $1/T$ and each represent the binary coded value of a sample. Such code words will hereinafter be referred to as "numbers".

Figure 2:
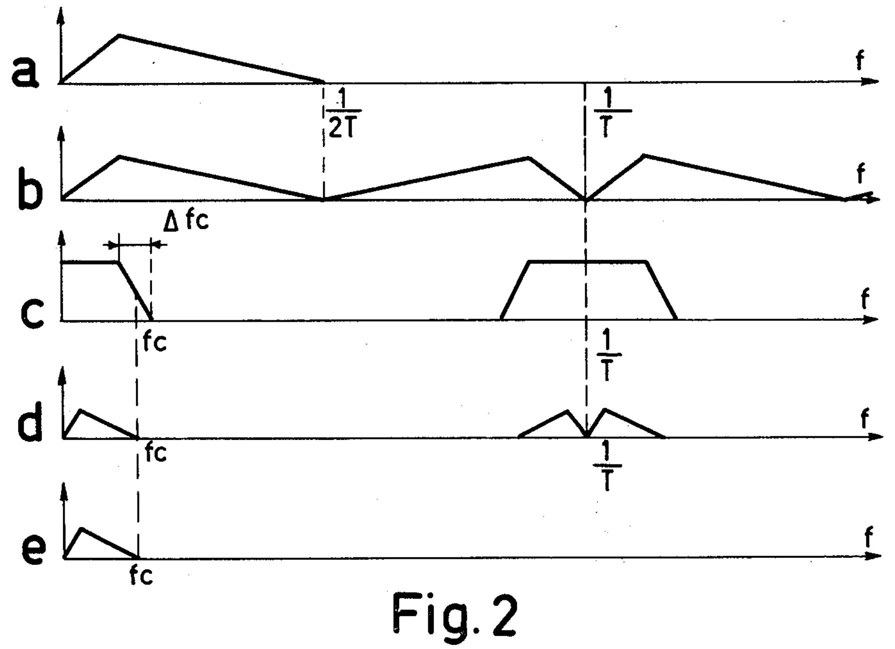
FIG. 2 shows spectra of the signals which are obtained at the input and output of the filter.

The spectrum of the analog signal to be filtered has the shape shown in FIG. 2*a;* this spectrum is limited at a frequency $1/2T$ which frequency is equal to half the sampling frequency. The spectrum at the output of the sampler 2 has the shape shown in FIG. 2*b*.

To realize a lowpass filter having a cut-off frequency $f_c$ for these numbers occurring at a frequency $1/T$ a transfer function must be realized which has the shape as shown in FIG. 2*c*. After processing the numbers occurring at the input terminal 5 this digital filter must produce numbers at its output 6 each of which represents the coded value of a sample of the filtered signal and which occur at the desired frequency $f'_s$. The output frequency $f'_s$ will hereinafter be chosen to be equal by way of example to the input frequency $1/T$. The numbers at the output of the digital filter are furthermore applied in this embodiment to a decoder 7 which produces analog signal samples in accordance with the numbers applied thereto at a frequency $1/T$. The frequency spectrum of the output signal of this decoder 7 thus has the shape as shown in FIG. 2*d*. These analog signal samples are subsequently converted in an analog filter 8 into a continuous analog signal which can be derived from the output 9 and whose frequency spectrum is shown in FIG. 2*c*.

In a known embodiment of a non-recursive filter which is arranged between the terminals 5 and 6 each number occurring at the output 6 is obtained by the weighted addition of a limited series of the numbers applied through the input 5 to the filter while each number of the series is multiplied by a given filter coefficient. Each number at the output 6 is then to be determined within a period T of the sampling frequency $1/T$.

Figure 3:
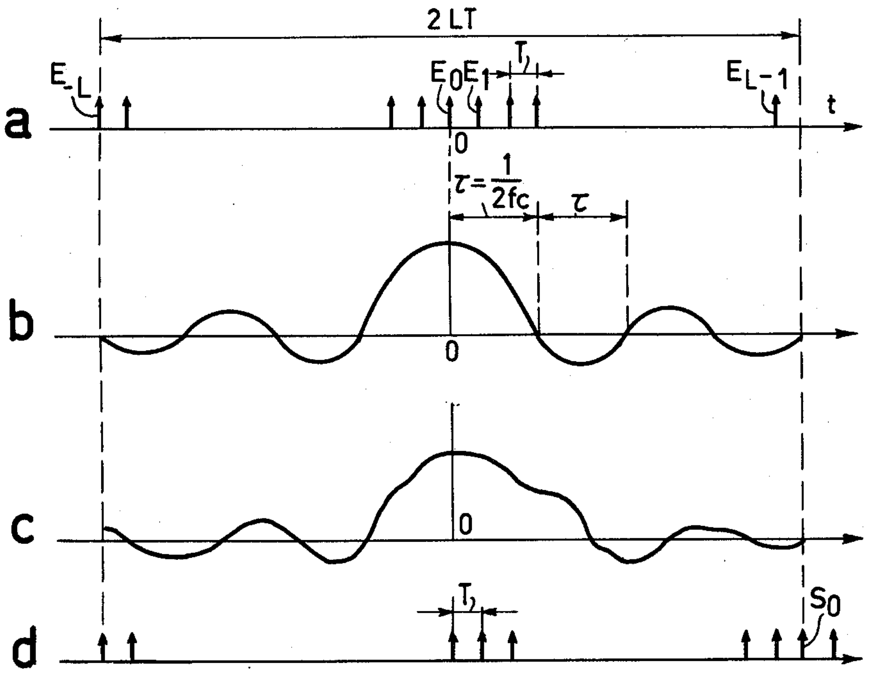
FIG. 3 shows time diagrams which illustrate the operation of a known non-recursive filter.

The calculations to be performed for determining a number occurring at the output 6 is further illustrated in FIG. 3*a*. This FIG. 3*a* shows a series 2L of samples $E_{-L} \ldots E_o \ldots E_{L-1}$ of the signal to be filtered. In this Figure each arrow represents both a sample and a binary number equivalent thereto. The successive samples are separated by the time interval $T$ and the 2L samples appear within the time interval $2LT$.

FIG. 3*b* shows the pulse response of the filter to be realized which is limited to this time interval $2LT$ where it is assumed that this filter has a linear phase characteristic and that its cut-off frequency is an integral fraction N of half the sampling frequency $1/2T$ which means that $N = 1/2T.f_c$ is an integer. The pulse response has the known $(\sin x)/x$ shape with a maximum value equal to 1 at the instant $t=0$ which lies in the centre of the said time interval $2LT$. In the more general case where the filter to be realized does not have a linear phase characteristic the pulse response may have a more intricate shape as is shown, for example, in FIG. 3*c*.

In a known non-recursive filter an output sample, for example, $S_o$ is determined from these 2L number $E_{-L} \ldots E_o \ldots E_{L-1}$ by using the equation:

$$S_0 = \sum_{i=-L}^{L-1} a_i E_i \qquad (1)$$

In this equation (1) in which i assumes all integral values which are located between $-L$ and $L-1$, $E_i$ represents the $2L$ samples as FIG. 3*a* and $a_i$ represents the values of the pulse response of the filter (FIG. 3*b* or 3*c*) at the instants when the samples $E_i$ occur. They are the values $a_i$ which are called the filter coefficients.

In a non-recursive filter an output sample such as $S_o$ is calculated in a period $T$ and numbers which occur at the frequency $1/T$ are obtained directly at the output of the filter. The series of numbers or samples thus obtained is shown in FIG. 3*d*. Particularly this Figure shows the number $S_o$ which occurs at the end of the time interval $2LT$.

Considered spectrally analytically, such an operation on the signal samples means that the input spectrum according to FIG. 2*b* of the non-recursive digital filter is directly converted into the output spectrum according to FIG. 2*d*.

It follows from equation (1) that in the general case (that is to say when given filter coefficients equal to zero are not taken into account) the number of multiplications to be performed for determining one output sample of the filter is equal to $2L$. Since the signal samples occur at the frequency $1/T$ the number of multiplications to be performed per second is equal to $$M_1 = 2L \cdot \frac{1}{T} \qquad (2)$$

In this expression (2) the factor $2L$ is representative of the limited duration $2LT$ of the considered pulse response while this duration of $2LT$ directly characterizes the slope $\Delta f_c/f_c$ of the filter. In this case $\Delta f_c$ is the bandwidth of the filter slope (see FIG. 2*c*).

However, for these known non-recursive filters there applies that for a given slope and thus for a given duration of the pulse response the number of coefficients $2L$ of the filter is proportional to the sampling frequency $1/T$ and that consequently the number of multiplications per second is proportional to the square of this sampling frequency. For this reason the use of non-recursive filters is limited and recursive filters are generally preferred. In fact, a given slope can be realized for recursive filters with a considerably smaller number of multiplications per second than is possible with non-recursive filters.

The invention has for its object to provide a novel conception of a digital filter in which inter alia circuits of the non-recursive type are used and with which for realizing a given slope a number of multiplications is to be performed per second which is at most equal to the number of multiplications to be performed per second in a recursive digital filter.

The digital filter according to the invention shown in FIG. 1 is provided with at least a first digital filter section 10 having a cut-off frequency $fm/2$ to which the binary coded samples occurring at a frequency $f_s$ are applied through an input terminal 5 and which supplies at its output 14 second code words occurring at a frequency $f_m$ which is at least euql to $2f_c$ and smaller than $f_s = 1/T$, the output 14 of said first section being directly coupled to the input of a second digital filter section in the form of an interpolating digital filter 11 having a cut-off frequency of $f_m/2$ to which third code words are applied which occur at the said frequency $f_m$ and which are related to said second code words, said interpolating digital filter supplying output code words in accordance with these third code words which output code words occur at the said sampling frequency $f'_s$ which is higher than the said sampling frequency $f_m$.

In the embodiment shown the first filter section is provided in the conventional manner with a calculator 12 and a source 13 for a given number of filter coefficients, which calculator is controlled by clock pulses generated by a clock pulse generator 15 and which occur at a frequency $f_m$ which is a fraction of the sampling frequency $1/T$ supplied by the generator 3. Also the interpolating digital filter 11 is provided in the conventional manner with a calculator 17 and a source 18 for a given number of filter coefficients and this calculator 17 is controlled by clock pulses occurring at a frequency $f'_s$ which are derived from the clock pulse generator 3.

In this embodiment it is assumed that the frequency $f_m$ is equal to $2f_c$. The cut-off frequencies of the first section and of the interpolating filter are equal to $f_c$ and the output 14 of this first filter section 10 is directly connected to the input 16 of the interpolating digital filter 11. It is also assumed that the output sampling frequency $f'_s$ is equal to the input sampling frequency $f_s = 1/T$ and that the ratio between $2f_c$ and the sampling frequency $f_s$ is an integer N where $$N = \frac{1}{2f_c T}.$$

Figure 4:
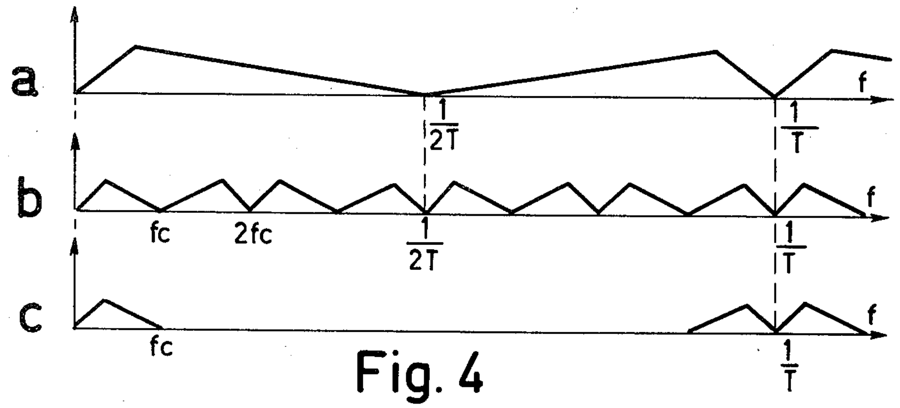
FIGS. 4 and 5 show frequency diagrams and time diagrams to explain the operation of the digital filter according to FIG. 1.

The diagrams of FIG. 4 show the spectra of the input and output signals of the first filter section 10 and the interpolating filter 11. More particularly the diagram of FIG. 4a shows the spectrum of the signal to be filtered and sampled with a frequency $f_s = 1/T$ at the input of the section 10. This first digital filter section 10 with a cut-off frequency $F_c$ supplies the said second code words at the frequency $2f_c$. The spectrum of the signal characterized by these code words thus has the shape which is shown by the diagram 4b and comprises the spectrum of the filtered analog signal in the band O — $f_c$ and picture spectra which are symmetrical about the frequency $2f_c$ and multiples thereof. The interpolating digital filter 11 with a cut-off frequency $f_c$ filters the signal with the frequency spectrum according to FIG. 4b and provides output code words of the frequency $1/T$. By using the interpolating filter all picture spectra are eliminated from the spectrum of FIG. 4b which are not located about the frequency $1/T$ and its multiples. The spectrum of the signal at the output of the interpolating filter 11 is shown in FIG. 4c.

In the embodiment shown in FIG. 1 a non-recursive filter structure is used for the first filter section 10 and for the interpolating filter 11.

In order to determine the weighted sums of coded samples as is common practice in the non-recursive filters which samples occur within a limited time interval of for example $2LT$ the calculator 12 of the first digital filter section has a cascade circuit of $2L - 1$ delay elements R. The output code words of the coder 4 are successively applied to this cascade circuit in the manner shown in the Figure and at a frequency $1/T$ and are shifted in this cascade circuit at the same frequency $1/T$. The $2L$ input and output terminals of these delay elements are each connected in the conventional manner as shown in the Figure to an input of a multiplier of a set of $2L$ multipliers M. One filter coefficient provided by the source 13 is applied through a second input to each multiplier. The outputs of the $2L$ multipliers M are connected to inputs of an adder circuir 19 whose output is conneted to the output 14 of the first digital filter section 10. The output of the generator 15 supplying the clock pulses at a frequency $f_m = 2f_c$ is connected to a control input of the multipliers M.

The calculator 17 of the interpolating filter 11 has a structure which is analogous to that of the calculator 12. This calculator also has a cascade circuit of delay elements R', multipliers M' to which filter coefficients from a source 18 are applied and whose outputs are connected to an adder circuit 20. However, code words of a frequency $2f_c$ are applied to this interpolating filter and are written in and shifted at this frequency in this cascade circuit. In the embodiment shown the cascade circuit of delay elements R' has $2P - 1$ elements in which $P = L/N$ and thus for determining an output sample of this interpolating filter the input samples are considered which occur within a period $2P/2f_c$ which period is equal to $2LT$, being the period within which the samples occur which are utilized for determining an output sample of the first filter section 10. The calculator 17 thus has $2P$ multipliers M' which are connected in the manner shown in the Figure to the delay elements R' to which multipliers filter coefficients are applied which are derived from said source 18 and which multipliers are controlled by clock pulses occurring at a frequency $1/T$ and generated by the generator 3. These clock pulses generated by the generator 3 are also applied to a pulse distributor 21 which distributes the clock pulses occurring within a period $NT = 1/2f_c$ cyclically over its $N$ outputs. These outputs of the pulse distributor 21 thus provide pulse signals which are indicated in the Figure by $L_o, L_1 \ldots L_{N-1}$. According to these N pulse signals, $N$ times $2P$ coefficients are applied within one sampling period $1/2f_c$ to the set of $2P$ multipliers $M'$.

The operation of the filter described according to the invention will now be further explained with reference to the different time diagrams of FIG. 5.

The diagram 5a shows $2L$ numbers which are applied to the first filter section 10. These numbers which occur within the time interval $2LT$ are indicated by $E_{-L}, \ldots, E_o, \ldots E_{L-1}$.

The diagram 5b shows the symmetrical pulse response of the lowpass filter to be realized which has a cut-off frequency of $f_c$ where $N.2f_c = 1/T$. This pulse response is limited in duration to a time interval of $2LT$ and for this filter a linear phase characteristic is assumed.

The diagram 5c shows the series of clock pulses which are applied by the generator 15 to the multipliers M. At the instant when the pulse $I_o$ occurs, that is to say, at the end of the time interval $2LT$, the calculator 12 produces the number Xo whose value is given by the expression $$X_0 = \sum_{i=-L}^{L-1} a_i E_i \qquad (3)$$

In this expression $E_i$ represents the $2L$ numbers of FIG. 5*a* and $a_i$ represents the $2L$ filter coefficients being the values of the pulse response given in FIG. 5*b* at the instants when the number $E_i$ occur.

The number $Xo$ represents a binary coded sample of the filtered signal. For successive output pulses from the pulse generator 3 the calculator 12 produces numbers which result from the same sort of elaboration as $Xo$ so that a series of numbers of the frequency $2f_c$ is obtained at the output 14 of this first filter section which represent the value of a sample of the filtered signal. This series of numbers is shown in FIG. 5*d*.

The expression (3) shows that each output sample of the first filter section is obtained by $2L$ multiplications in the calculator 12. Thus the number of multiplications per second is equal to:

$$M_2 = 2L.2f_c \qquad (4)$$

The diagram 5*e* shows a series of $2P$ input samples of the interpolating filter. These samples which occur within the time interval $2LT$ are shown in the Figure by $Y_{-PN}, \ldots, Y_{-N}, Y_o, Y_N, \ldots, Y_{(P-1)N}$. In the diagram 5*f* the solid line curve represents the pulse response of a lowpass filter having a linear phase characteristic and a cut-off frequency of $f_c$, which pulse response is symmetrical relative to the line $t = 0$ which is considered as the centre of the time interval $2LT$. This time interval $2LT$ is divided in $2P$ time intervals $\tau$ where $\tau$ is the time interval between two successive input samples of the interpolating filter 11. In FIG. 5*g* the series of output pulses from the clock pulse generator 3 is shown which pulses are cyclically denoted in the Figure by $L_o, L_1 \ldots L_{N-1}$.

According to the pulse $I_o$ which occurs at the end of the interval $2LT$ the calculator 17 provides the number $\sigma$ o whose value is given by the expression $$\sigma_0 = \sum_{k=-P}^{p-1} a_k Y_k \qquad (5)$$

where $Y_k$ represents the $2P$ numbers of FIG. 5*e* and $a_k$ represents the $2P$ values of the pulse response (filter coefficients) shown in FIG. 5*f* by the uninterrupted curve at the instants when the numbers $Y_k$ occur. The coefficients $a_k$ are provided by the source 18 according to the pulse Lo and are applied to the multipliers M' to which also the numbers $Y_k$ are applied.

At the instant of occurrence of the pulse $L_1$ which pulse occurs a time T after the pulse *L*0 the same numbers $Y_k$ are applied to the multipliers M' (where also $k$ assumes all integral values of $-P$ to $P$–1) as for the calculation of $\sigma$ 0. According to the pulse $L_1$, however, coefficients $a_{k-1}$ are applied to the multipliers M' which coefficients represent the values of the pulse response shown by a broken line in FIG. 5*f* at the instants when the numbers $Y_k$ occur. The broken line curve is obtained by displacing the solid line curve (pulse response) over a time $+T$. According to the pulse $L_1$ the calculator 17 thus provides the number $\sigma_1$ whose value is given by the expression:

$$\sigma_1 = \sum_{k=-p}^{p-1} a_{k-1} Y_k \qquad (6)$$

The calculator 17 operates in the same manner for the other pulses $L_i$ provided by the pulse distributor 21 which are associated with a given cycle and thus produces the numbers $\sigma_o, \sigma_1, \ldots, \sigma_i, \ldots \sigma_{N-1}$.

At the instant when a pulse Lo appears a new configuration of $2P$ numbers $Y_k$ is applied to the multipliers M' and according to the pulses $L_i$ of this cycle the calculator 17 provides the numbers $\sigma_N, \sigma_{N+1}, \ldots, \sigma_{N+1}, \ldots, \sigma_{2N-1}$.

The output code words of the interpolating filter 11 occur at the frequency $1/T$ as well as the pulses $L_1$. The series of numbers n thus obtained is shown in FIG. 5*h*.

Figure 5:
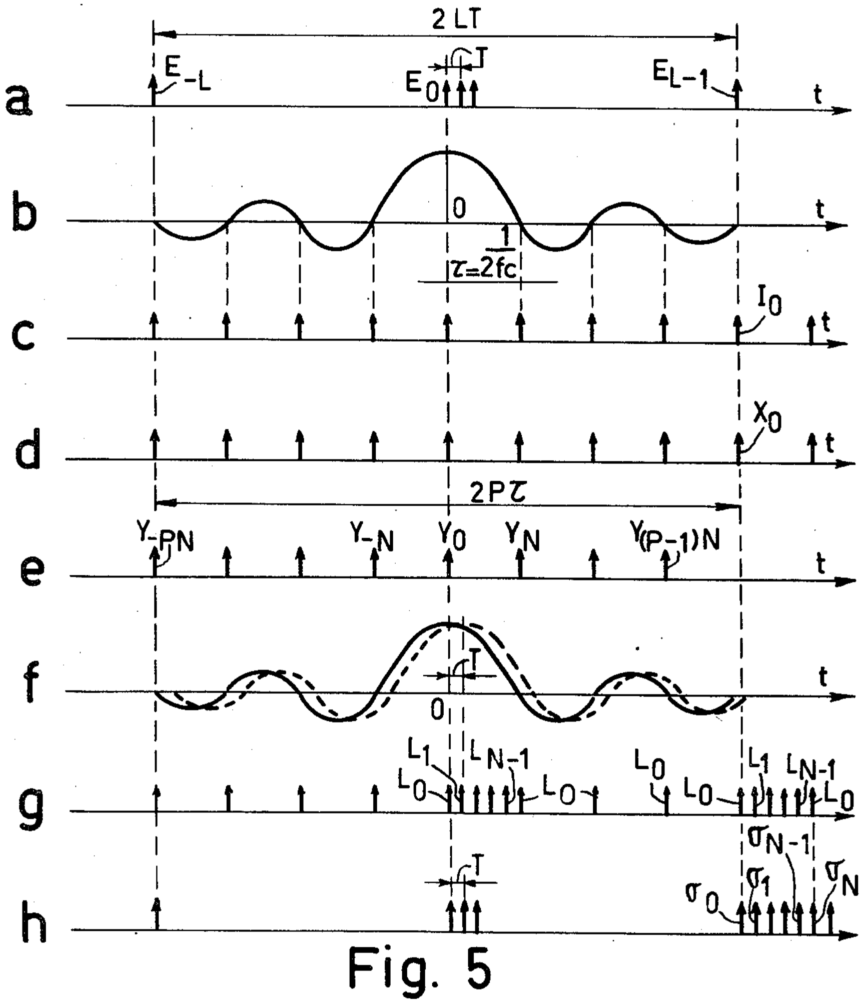

In the case shown in FIG. 5 where the ratio $$N = \frac{1}{2f_c\, T}$$

is an integer, the output code words $\sigma_o, \sigma_N, \sigma_{2N}, \ldots$ of the interpolating filter have the same value as the numbers $Y_o, Y_N, Y_{2N}$ etc. The output code words $\sigma_1, \sigma_2 \ldots \sigma_{N-1}$ which are generated in accordance with the pulses $L_1, L_2, \ldots L_{N-1}$ constitute the code words interpolated between the samples $\sigma_o, \sigma_N, \sigma_{2N}$ etc. This interpolation of code words is effected at instants which are an interval $T$ apart. Ultimately numbers are obtained as desired at the output of the interpolating filter 11 which occur at a frequency $1/T$ which, taking the position of the interpolation into account, each represent a sample of the filtered signal.

It follows from the expressions (5) and (6) that for the calculation of each output code word of the interpolating filter 11 a maximum of $2P$ multiplications is to be performed so that a number of multiplications per second performed by the interpolating filter is given by the expression $M_3 = 2\ P\ 1/T$.

Taking the fact into account that $$2LT = 2P \cdot \frac{1}{2f_c}$$

there follows that:

$$M_3 = 2L.\ 2f_c \qquad (7)$$

By adding the numbers $M_2$ and $M_3$ (compare expressions (4) and (7) the total number of multiplications which is performed per second in the digital filter according to the invention is obtained. This number is thus given by $M_4 = 2.2L.2f_c$.

To compare the numbers $M_4$ and $M_1$ these numbers may alternatively be written in a different manner, namely as follows (compare expressions (2) and (7)):

$$\begin{cases} M_1 = \dfrac{2L}{T} = (2LT) \left(\dfrac{1}{T}\right)^2 \\ M_4 = 2 \cdot 2L \cdot 2f_c = 2(2LT)\ \dfrac{1}{T} \cdot 2f_c \end{cases} \qquad (8)$$

This expression shows that for a given slope which is characterized by the final duration $(2LT)$ of the pulse response the number $M_1$ is proportional to the square of the sampling frequency $1/T$ at the input of the filter and that $M_4$ is proportional to the product of the frequency $1/T$ and the frequency $2f_c$ (or more generally $f_m$) at the output of the first digital filter section.

The difference between the known embodiment of a non-recursive filter and the filter according to the invention is still clearer when the ratio $$N = \frac{1}{2f_c \cdot T}$$

is introduced and when the numbers $M_1.T$ and $M_4.T$ are compared which each represent the number of multiplications necessary for calculating an output code word.

By simple derivation the expressions (8) change to:

$$\begin{cases} M_1 \,.\, T = N \,.\, (2LT)2f_c \\ M_4 \,.\, T = 2 \,.\, (2LT)2f_c \end{cases} \qquad (9)$$

This expression shows that for a given frequency $f_c$ and a given slope the number of multiplications for determining one output code word in the known embodiment of a non-recursive filter is proportional to $N$ and is independent of $N$ in the filter according to the invention.

Figure 6:
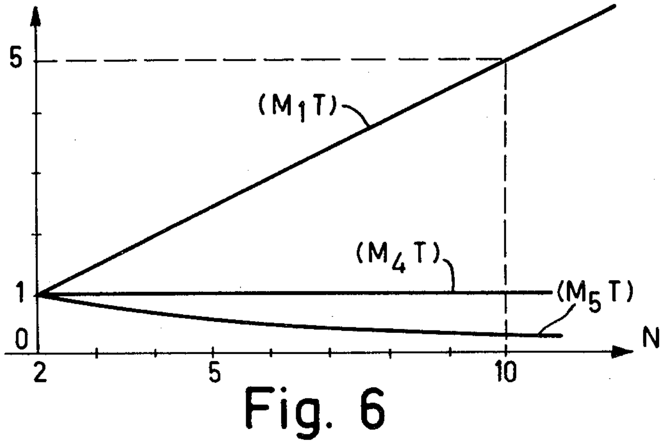
FIG. 6 shows graphs which illustrate the gain relative to the number of multiplications performed per second in the filter according to the invention.

In FIG. 6 the number of multiplications to be performed per output code word for different digital filter configurations is graphically represented as a function of $N$ where $N$ is assumed to be $\geqslant 2$. The horizontal straight line $M_4.T$ with an arbitrary ordinate corresponds to the filter according to the invention. The slanting line $M_1.T$ corresponds to the known embodiment of a non-recursive filter. For $N=2$ which characterizes a half-bandpass filter (i.e. a filter having a passband of $O - f_c$ which is equal to half the bandwidth $O - 1/2T$
where $1/T$ is the sampling frequency) the number of multiplications is equal for both filters. For $N > 2$ a reduction of the number of multiplications which reduction is the greater as $N$ is larger relative to the known embodiment of non-recursive digital filters is obtained with the filter according to the invention. For example in the case where $N=10$ the number of multiplications to be performed is only one fifth of the number of multiplications required in the known embodiment of the non-recursive digital filters.

It is to be noted that it is not necessary to choose the frequency $f_m$ to be equal to $2f_c$. The frequency $f_m$ may be higher without any drawback and the operation of the filter is the same but the reduction of the number of multiplications per second is then, however, smaller.

Figure 7:
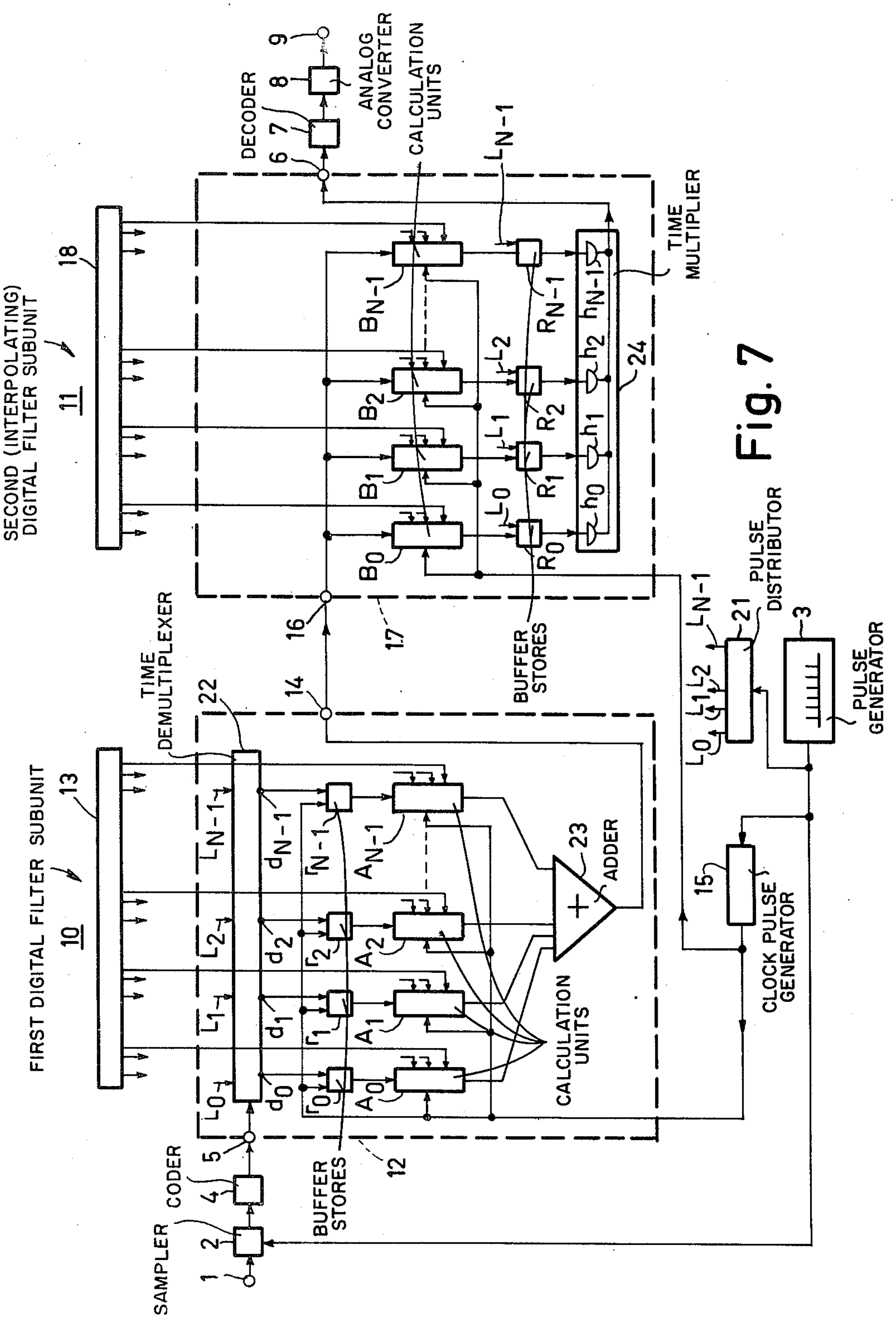
FIG. 7 shows a modification of the filter according to FIG. 1.

FIG. 7 shows a modification of the filter according to FIG. 1. In this FIG. 7 elements corresponding to those in FIG. 1 have the same reference numerals. This FIG. 7 differs from FIG. 2 in the embodiment of the first digital filter section and the interpolating filter. Also in this digital filter calculators of the non-recursive type and of the recursive type may be used. The frequency $f_m$ is taken to be equal to $2f_c$ in this digital filter and the output of the first digital filter section 10 is directly connected to the input of the interpolating digital filter 11 while furthermore it is assumed that the ratio $N = 1/(T.2f_c)$ is an integer.

In the embodiment according to FIG. 7 the calculator 12 includes a time demultiplexer 22 in which the numbers applied through the input 5 are written in and which applies the numbers located within the time interval $NT = 1/2f_c$
successively to its $N$ outputs $do$, $d_1$, . . . $d_{N-1}$. This demultiplexer is controlled by N pulse signals Lo, $L_1$, . . . $L_{N-1}$ which are supplied by the pulse distributor 21. Thus the numbers with a frequency $2f_c$ occur at each of the outputs $do$, $d_1$, . . . $d_{n-1}$ and number with a mutual time delay $T$ occur every time at juxtaposed outputs (for example $do$ and $d_1$). These numbers are applied to N buffer stores $ro$, $r_1$, . . . $r_{N-1}$ all of which are simultaneously read with a repetition frequency of $2f_c$. The outputs of the $N$ buffer stores are connected to an input of $N$ calculation circuits Ao, $A_1$ . . . $A_{N-1}$. $2P$ coefficients are applied to each of these circuits which coefficients are provided by the source 13. Each calculation circuit supplies the weighted sum of $2P$ input samples with $2P$ filter coefficients and these weighted sums are determined in a time $1/2f_c$. The output code words occurring at a frequency $2f_c$ of the $N$ calculation circuits are applied to the adder circuit 23 with $N$ inputs and the output code words of this adder circuit 23 are applied at a frequency $2f_c$ to the output 14 of the first filter section.

The calculator 17 of the interpolating filter 11 has $N$ calculation sections Bo, $B_1$ . . . $B_{N-1}$. An input of each of these calculation sections is connected to the input 16 so that the output code words of the first filter section occurring at a frequency $2f_c$ are applied to these calculation sections. Also $2P$ coefficients which are supplied by the source 18 are applied to each of these calculation sections. Each calculation section provides the sum of $2P$ number while each of these numbers constitutes the product of an output code word of the first filter section and a filter coefficient originating from the source 18. the output code words of the calculation section occur for all calculation sections Bo, . . . , $B_{N-1}$ simultaneously with a repetition frequency of $2f_c$. These code words are applied to N buffer stores Ro, $R_1$ . . . $R_{N-1}$. These stores are read successively under the control of pulse signals Lo, $L_1$ . . . $L_{N-1}$ which are supplied by the pulse distributor 21 so that the code words supplied by the N buffer stores occur regularly in the time after each other within the same interval $$NT = \frac{1}{2f_c}.$$

The outputs of the buffer stores are connected to the time multiplexer 24 which is simply formed by gates $ho$, $h_1$ . . . $h_{N-1}$ whose inputs are connected to the outputs of the registers and whose outputs are connected together and to the output 6 of the filter.

For a further explanation of the operation of the filter of FIG. 7 it is assumed for the sake of simplicity that $$N = \frac{1}{2Tf_c} = 3.$$

This means that the low-pass filter to be realized has a cut-off frequency which is equal to one-third of half the sampling frequency at the input of the filter.

Figure 8:
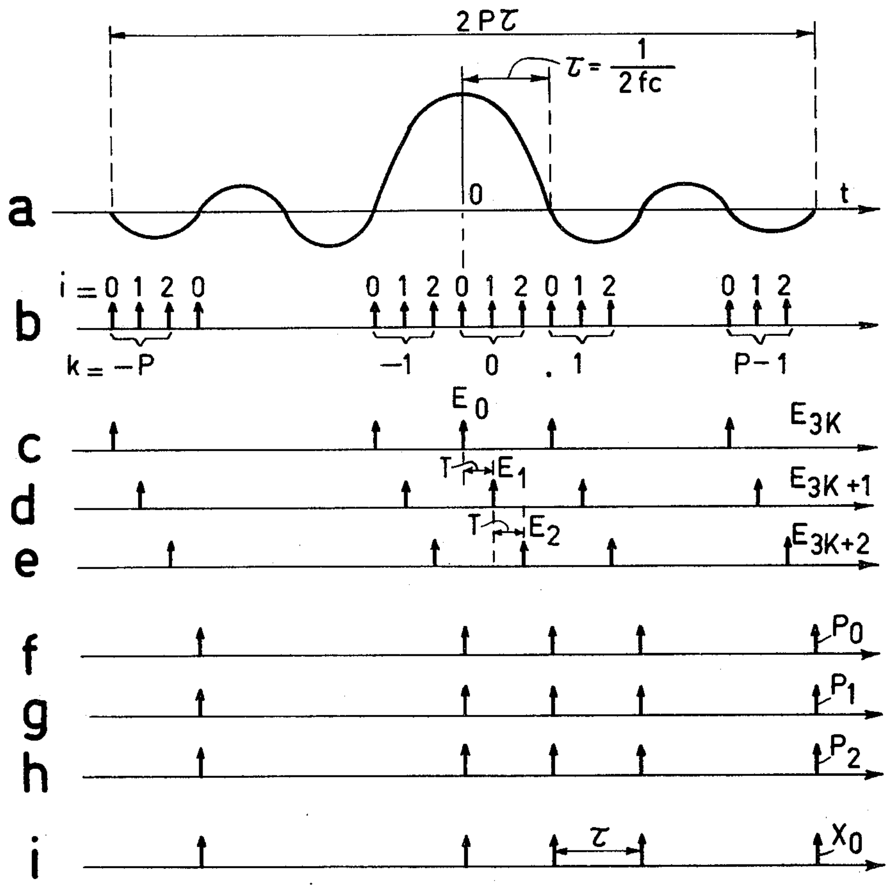
FIGS. 8 and 9 show a number of time diagrams to explain the operation of the filter illustrated in FIG. 7.

The operation of the first filter section 10 is illustrated in greater detail in the diagrams of FIG. 8. FIG. 8$a$ shows the pulse response of the low-pass filter to be realized which pulse response has the value of zero for the instant $n\,\tau$, *where*

$$\tau = \frac{1}{2f}$$

and $n = \pm 1, \pm 2, \ldots$ FIG. 8$b$ shows a series of $2P.N$ samples which occur at a frequency $1/T$ and which are applied through the input 5 to the filter. In this case it is assumed that these $2PN$ samples are symmetrically located about the line $t = 0$ of the pulse response. Unlike the calculator 12 of FIG. 1 in which each output code word of the first filter section is obtained by performing all required multiplications and additions with the $2PN$ input code words in a single stage, the additions in the calculator 12 of FIG. 7 are performed in two stages. To further clarify this the samples of FIG. 8*b* are denoted by $E_{i+Nk}$ where $i$ assumes all integral values of from 0 to N–1 and thus characterizes every time one of the $N$ samples in a time interval. In the embodiment shown where $N = 3$, $i$ only assumes the values 0, 1 or 2 (see FIG. 8*b*). On the side of the positive times comprising the instant $t = 0$, $t$ assumes all integral values of from 0 to $P - 1$ and thereby characterizes each of the $P$ time intervals located on the side of the positive times. On the side of the negative times k assumes all integral values of from –1 to $-P$. When analogous to the above filter coefficient is represented by $a_{i+Nk}$ the value of an output sample of the first filter section is given by the expression:

$$X_0 = \sum_{i=O}^{N-1} \sum_{k=-P}^{P-1} 1_{i+Nk} \cdot E_{i+Nk} \qquad (10)$$

The two additions are performed one after the other with the aid of the calculator 12 of FIG. 7.

In the considered example where $N = 3$ the expression (10) changes to:

$$X_0 = \sum_{i=O}^{2} \sum_{k=-p}^{p-l} 1_{i+3k} \cdot E_{i+3k} \qquad (11)$$

The series of samples $E_{i+3k}$ of FIG. 8*b* are then applied to the input of the time demultiplexer 22. Three series of numbers shown in the FIGS. 8*c*, 8*d* and 8*e* occur at the outputs $do$, $d_1$, $d_2$ of this demultiplexer. The series of numbers at the output $do$ (FIG. 8*c*) corresponds to the series of samples $E_{i+3k}$ for $i = 0$. The series of numbers at the output $d_1$ (FIG. 8*d*) corresponds to the series of samples $E_{i+3k}$ for $i = 1$. The series of numbers at the output $d_2$ (FIG. 8*e*) corresponds to the series of samples $E_{i+3k}$ for $i = 2$. Due to the action of the demultiplexer the numbers occur in each series at a frequency $2f_d$; the numbers at the output $d_1$ are, however, shifted over the period $T$ in time relative to the numbers at the output $do$ and the numbers at the output $d_2$ are shifted in time over a period $T$ relative to the numbers at the output $d_1$.

These numbers at the output $do$, $d_1$, $d_2$ are applied to the buffer stores $ro$, $r_1$, $r_2$ which are simultaneously read so that all numbers stored in this buffer store occur simultaneously at the input of the calculation sections $A$o, $A_1$, $A_2$. More particularly this means that as is illustrated in the FIGS. 8*c*, 8*d* and 8*e* the numbers at the output $do$ (FIG. 8*c*) are shifted by $+3T$, the numbers at the output $d_1$ (FIG. 8*d*) are shifted by $+2T$ and the numbers at the output $d_2$ (FIG. 8*e*) are shifted by $+T$.

The calculation sections Ao, $A_1$, $A_2$ then determine the sum over P given in the expression (11) and thus yield the code words $\rho o$, $\rho_1$, $\rho_2$ defined in the following manner:

$$\begin{cases} C_0 = \sum_{k=-p}^{p-1} a_{3k} \cdot E_{3k} \\ C_1 = \sum_{k=-p}^{p-1} a_{3k+1} \cdot E_{3k+1} \\ C_2 = \sum_{k=-p}^{p-1} a_{3k+2} \cdot E_{3k+2} \end{cases} \qquad (12)$$

To this end the series of numbers $E_{3k}$, $E_{3k+1}$ and $E_{3k+2}$ as well as $2P$ filter coefficients are applied to these calculation sections Ao, $A_1$, $A_2$.

The numbers $\rho_0$, $\rho_1$, $\rho_2$ simultaneously appear at the outputs of the calculation sections A0, $A_1$, $A_2$ and these numbers are shown in the FIGS. 8*f*, 8*g* and 8*h* and occur at the end of the time interval $2P\ \tau$. It is to be noted that the number $\rho_0$ is equal to the sample $E_0$ but its instant of occurrence relative to the instant of occurrence of $E_0$ is shifted over a time $P\ \tau$ so that the calculation section A0 can be simply realized as a delay circuit with a delay time of $P\ \tau$.

Figure 9:
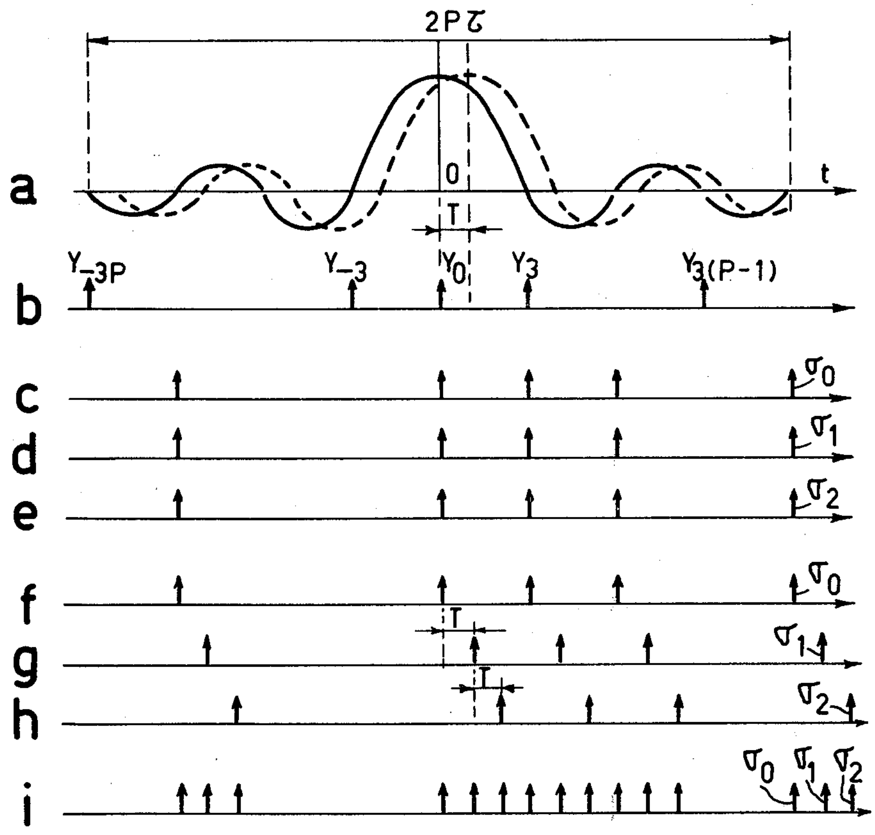

The numbers $\rho_0$, $\rho_1$, $\rho_2$ are subsequently added in an adder circuit 23 which thus performs the addition over i in the expression (11) for X0. Thus code words are obtained at the output of the adder circuit 23 (compare FIG. 8*i*) which occur at a frequency $2f_c$ and which are applied to the interpolating filter 11 whose operation will be further described with reference to FIG. 9.

In FIG. 9*a* the pulse response of the lowpass filter having a cut-off frequency of $2f_c$ is also shown, but this is limited to the time interval $2P\ \tau$. The values of the pulse response at instants which are mutually spaced apart over $T$ are again denoted by $a_{i+Nk}$. Also in this case it is assumed that $N = 3$ so that the filter coefficients can be written as $a_{i+3k}$.

FIG. 9*b* shows a limited series of numbers applied to the interpolating filter during a time interval $2P\,\tau$ which are denoted in this case by $Y_{3k}$ where $k$ assumes all integral values of from $-P$ to $P - 1$.

These numbers $Y_{3k}$ are applied together with $2P$ filter coefficients to the calculation sections B0, $B_1$, $B_2$. More particularly the coefficient $a_{3k}$ is applied to the calculation section B0, the coefficient $a_{3k-1}$ is applied to the calculation section $B_1$ and the coefficient $a_{3k-2}$ is applied to the calculation section $B_2$.

The calculation sections B0, $B_1$, $B_2$ provide a code word $\sigma_i$ for each pulse from the pulse generator 15 as a function of the input code words $Y_n$ and the associated filter coefficients $a_n$. More particularly the calculation sections B0, $B_1$, $B_2$ provide the code words $\sigma_0$, $\sigma_1$, $\sigma_2$ which are defined as:

$$\begin{cases} \sigma_0 = \sum_{K=-P}^{p-l} a_{3K} - Y_{3K} \\ \sigma_1 = \sum_{K=-P}^{P-l} a_{3K-1} \cdot Y_{3K} \\ \sigma_2 = \sum_{K=-P}^{P-l} a_{3K-2} \cdot Y_{3K} \end{cases} \qquad (13)$$

The series of numbers which are provided by B0, $B_1$, $B_2$ are shown in the FIGS. 9*c*, 9*d* and 9*e*, respectively.

Since all coefficients $a_{3K}$ are zero for calculating $\sigma_0$ with the exception of the coefficient $a_0$ which is equal to 1, $\sigma_0$ has the same value as $Y_0$. FIGS. 9*b* and 9*c* show that $\sigma_0$ relative to $Y_0$ is shifted over $P\ \tau$. The calculation section B0 may therefore be formed as a simple delay circuit with this delay time $P\tau$.

The expression for $\sigma_1$ in formula (13) shows that the numbers $Y_{3K}$ are multiplied by the coefficients $a_{3K-1}$ which coefficients are obtained by shifting the pulse response providing the coefficients $a_{3k}$ over a time $+T$ (compare the broken line curve in FIG. 9a). $\sigma_1$ thus is the interpolated value between $Y_0$ and $Y_3$ at the instant $+T$ following $Y_0$. The expression for $\sigma_2$ in formulas 13 shows that the numbers $Y_{3K}$ are multiplied by the coefficients $a_{3K-2}$ which coefficients are obtained by shifting the pulse response supplied by the coefficient $a_{3K}$ over the time $+2T$. Thus $\sigma_2$ is a second interpolated value between $Y_0$ and $Y_3$ and this value occurs at an instant $+2T$ following the instant of occurrence of $Y_0$.

Consequently the numbers $\sigma_0$, $\sigma_1$, $\sigma_2$ occur at the output of the calculation sections B0, $B_1$, $B_2$ in which case the numbers $\sigma_0$ are nothing else than the numbers which occur at the input of interpolating filter, however, delayed over the time $P\tau$ and in which the numbers $\sigma_1$ and $\sigma_2$ are the interpolated values at interpolation instants which are regularly distributed between two successive input numbers.

Since the interpolated numbers $\sigma_1$ and $\sigma_2$ occur simultaneously with the numbers $\sigma_0$ it is necessary that they are shifted so that they are located between the numbers $\sigma_0$ and occur at instants which correspond to interpolation instants. To this end the outputs of the calculation sections B0, $B_1$, $B_2$ are connected to inputs of buffer stores R0, $R_1$, $R_2$ in which only one number can be written. These buffer stores are read one after the other under the control of read pulses L0, $L_1$, $L_2$ which occur a time T after each other and are periodically repeated with a period of $3T = 1/2f_c$. In the FIGS. 9f, 9g and 9h these series of numbers are shown at the outputs of the registers R0, $R_1$, $R_2$.

The outputs of the stores R0, $R_1$, $R_2$ are connected to the time multiplexer 24 which applies to the output 6 of the filter a series of numbers $\sigma_0$, $\sigma_1$, $\sigma_2$ at the frequency $1/T$ (see FIG. 9i).

it will be readily evident that the number of multiplications performed per second in both the first filter section and in the interpolating filter is equal to $2PN.2f_c$ so that the total number of multiplications per second in the filter is equal to $2.2PN.2f_c$ which is equal to the number of multiplications in the filter according to FIG. 1.

In the filter according to FIG. 7 the calculation sections of the first filter section and those of the interpolating filter are controlled by pulse signals of equal frequency namely of the lowest occurring frequency $2f_c$.

In the above described filter of FIG. 7 the calculation sections A0, $A_1$ . . . $A_{N-1}$ and B0, $B_1$ . . . $B_{N-1}$ of the non-recursive type can be used. Such calculation sections have the advantage that no phase distortions are produced by the filter but amplitude distortions are caused. This means that the transfer function of the filter is not completely flat in the passband and particularly not in the vicinity of the cut-off frequency. Such a distortion is a result of the finite duration of the pulse response. It will be described hereinafter that in the filter of FIG. 7 also calculation sections of the recursive type can be used which do not produce amplitude distortions but do produce phase distortions which can, however, be maintained small in a sample manner.

To clarify the use of such a calculation section another interpretation is given of the operation of the filter of FIG. 7 hitherto described. The starting point is the frequency spectrum of the incoming signals and the influence of the calculators 12 and 17 on the spectra is checked. Another starting point is the above described example where the cut-off frequency $f_0$ of the filter is equal to one third of half the sampling frequency $1/2T$ at the input of the filter; i.e.: $N = 3$.

Figure 10:
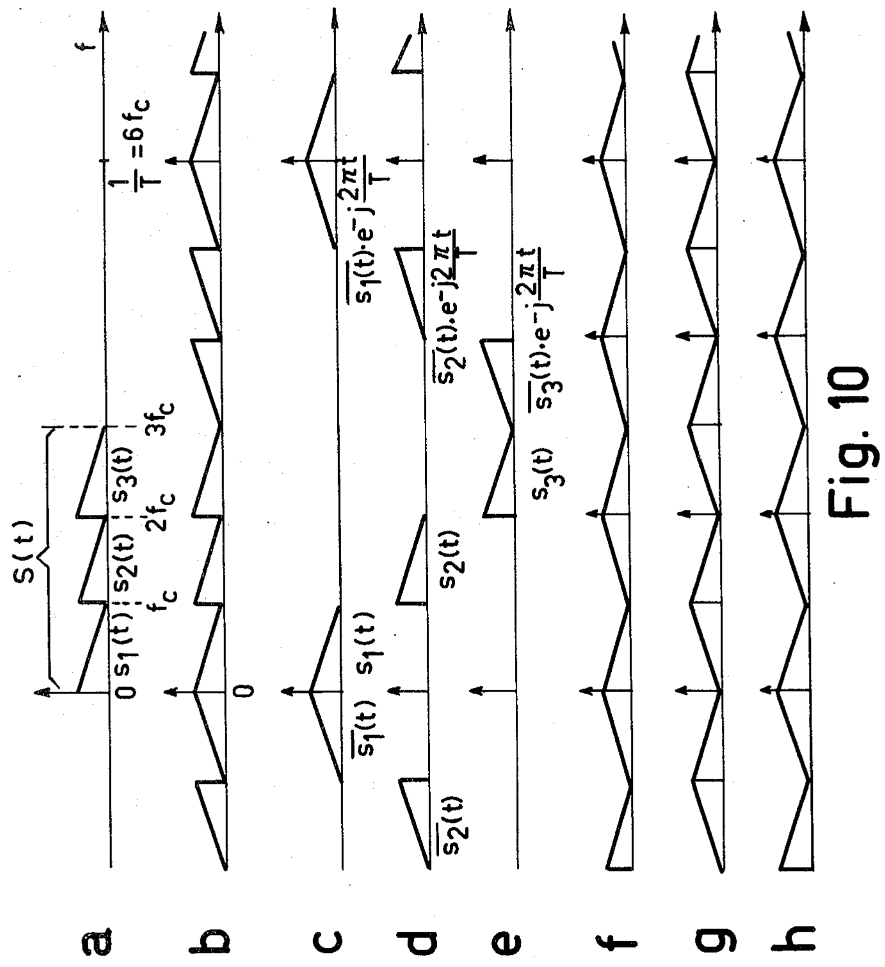
FIGS. 10 and 11 show signal spectra and a table to explain the operation of the filter according to FIG. 7.

The analog signal $S(t)$ to be filtered which is present at the input of the filter is in this case considered to be the result of the superimposition of three signals $s_1(t)$, $s_2(t)$, $s_3(t)$ which occupy the frequency bands $(0 - f_c)$, $(f_c - 2f_c)$ and $(2f_c - 3f_c)$ in FIG. 10. The filter operation then is the extraction of the signal $s_1(t)$ from $s(t)$.

The spectrum of the series of samples occurring at a frequency $1/T$ and shown in FIG. 8b which samples are generated by the device 4 is shown in FIG. 10b. This spectrum comprises the spectra of the three signals $s_1(t)$, $s_2(t)$ and $s_3(t)$ in the band of from 0–$3f_c$ and repetition of these spectra about the sampling frequency $1/T$.

FIGS. 10c, 10d, 10e show the spectra of the sampled signals $s_1(t)$, $s_2(t)$, $s_3(t)$ in which for each part of the spectrum a mathematical expression has been given. Thus of the signal $s_1(t)$ (FIG. 10c) the partial spectrum located in the frequency band of 0–$f_c$ is indicated by $s_1(t)$ and the partial spectrum located in the frequency band of from 0 to $f_c$ is indicated by the conjugated expression $\overline{s_1(t)}$. The partial spectra of $s_1(t)$ which are located about the sampling frequency $1/T$ may be considered as signals which are obtained by modulation of the signals with spectra $s_1(t)$ and $\overline{s_1(t)}$ on carriers exp $(-j2\pi t/T)$. The partial spectra in the frequency bands of $1/T$ to $(1/T - f_c)$ and from $1/T$ to $(1/T + f_c)$ may therefore be mathematically represented by: $s_1(t) . \exp(-j2\pi t/T)$ and $s_1(t) . \exp(-j2\pi t/T)$. Analogously the partial spectra of the signals $s_2(t)$ and $s_3(t)$ shown in FIGS. 10d and 10e can be represented mathematically.

The series of samples occurring at the outputs $d$0, $d_1$, $d_2$ of the demultiplexer 22 which are indicated in the FIGS. 8c, 8d and 8e by $E_{3K}$, $E_{3K+1}$, $E_{3K+2}$, respectively, and which occur at a frequency $2f_c$ characterize the sum of these three signals $s_1(t)$, $s_2(t)$, $s_3(t)$. When each of these signals is sampled at a frequency $2f_c$, the frequency spectra of these signals show the shape as is shown in the FIGS. 10f, 10g and 10h.

Although the spectra of the signals occurring at the outputs of the demultiplexer 22 are equal they have a mutual phase shift. In fact the series of samples $E_{3K}$, $E_{3K+1}$ and $E_{3K+2}$ occur with a mutual time delay $T$. The mutual phase shifts connected with this time delay are further shown in FIG. 11 in the form of a table.

Figure 11:
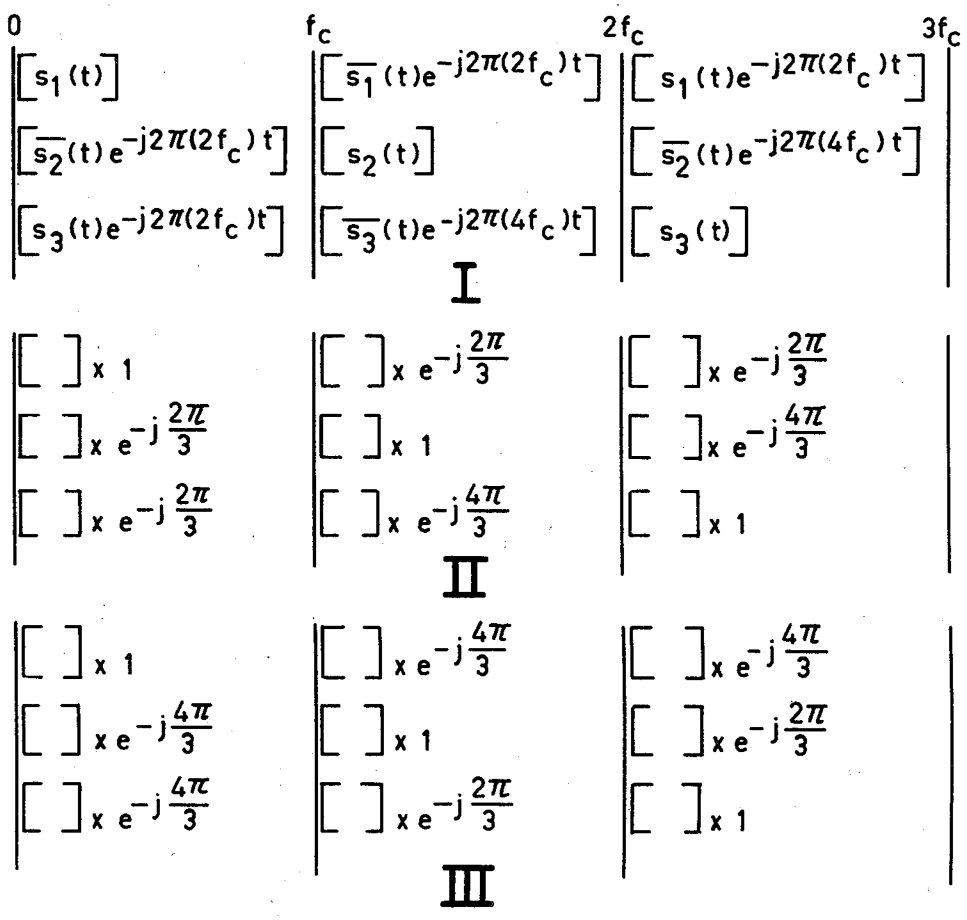

Table I of FIG. 11 shows expressions for the three signals $s_1(t)$, $s_2(t)$, $s_3(t)$ in which it is assumed that they are sampled at a frequency of $2f_c$. The sum of these signals provides the series of samples $E_{3K}$ for the output do. The band of $0 - 3f_c$ has been limited.

More particularly the first line of table I states the expressions corresponding to the three partial spectra of the signal $s_1(1)$ within the band $0 - 3f_c$ (see FIG. 10): the spectrum in the band $(0 - f_c)$ corresponds to the signal $s_1(t)$ itself. The partial spectrum in the band $(f_c - 2f_c)$ corresponds to the conjugated signal $\overline{s_1(t)}$ which is modulated on a carrier signal having a frequency of $2f_c$ of the partial spectrum in the band $(2f_c - 3f_c)$ corresponds to the signal $s_1(t)$ modulated on a carrier with the frequency $2f_c$.

The second and third lines of the table I state the expressions for the three partial spectra of the signals $s_2(t)$ and $s_3(t)$ in the band $(0 - 3f_c)$ (see FIGS. 10*g* and 10*h*). As is shown in this table I given partial spectra are obtained by modulation on a carrier of either the signals $s_2(t)$ or $s_3(t)$ or the conjugated signals $\overline{s_2(t)}$ or $\overline{s_3(t)}$.

Table II of FIG. 11 relates to expressions of the three signals $s_1(t)$, $s_2(t)$, $2_3(t)$ which are sampled with the frequency $2f_c$ and whose sum provides the series of samples $E_{3K+1}$ at the output $d_1$ of the demultiplexer 22. To clearly show the difference from the expressions of table I only the factors with which the expressions placed between brackets in table I must be multiplied are shown. These factors are obtained in the following manner: the samples $E_{3K+1}$ (FIG. 8*d*) are shifted over a time $T$ relative to the samples $E_{3k}$ (FIG. 8*c*); this means over a time which is one third of the sampling period $1/2f_c$. In the frequency domain such a time shift involves a phase shift of $+2\pi/3$ for the carrier signal with the frequency $2f_c$ and a phase shift of $+4\pi/3$ for the carrier signal with the frequency $4f_c$. A carrier signal of the frequency $2f_c$ which is mathematically shown in table I of FIG. 11 with $\exp(-j2\pi2f_ct)$ may thus be mathematically represented for table II of FIG. II by $\exp(-j2\pi2f_ct) \cdot \exp(-j2\pi/3)$. The multiplication factor shown in table II is therefore $\exp(-j2\pi/3)$. In the same manner a multiplication factor of $\exp(-j4\pi/3)$ applies for a carrier signal of the frequency $4f_c$.

Table III of FIG. 11 relates to the expression of the three signals $s_1(t)$, $s_2(t)$ and $s_3(t)$ each being sampled with the frequency $2f_c$ and whose sum provides the series of samples $E_{3K+2}$ at the output $d_2$ of the demultiplexer 22. Also in this table III only multiplication factors are given for the expressions of table I. Since the samples $E_{3K+2}$ are shifted over a time $+2T$ relative to the samples $E_{3K}$, the carrier signals of the frequencies $2f_c$ and $4f_c$ undergo and additional phase shift of $+4\pi/3$ and $8\pi/3$ so that the multiplification factors become: $\exp(-j4\pi/3)$ and $\exp(-j8\pi/3)$, respectively, the latter factor being equal to $\exp(-j2\pi/3)$.

Figure 12:
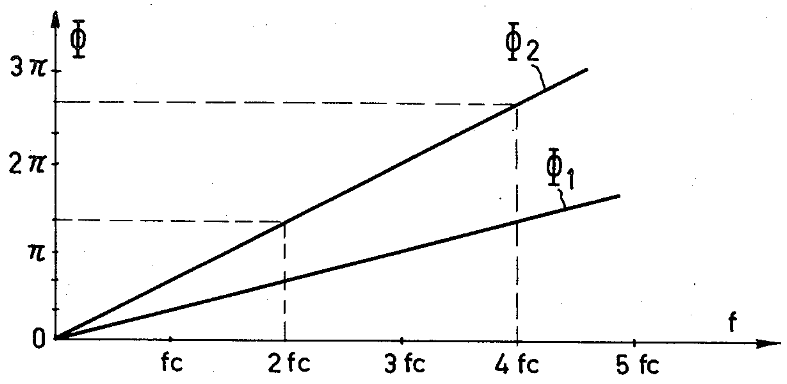
FIGS. 12, 13 and 14 show phase-versus-frequency characteristics to explain the operation of the filter according to the invention.

The series of samples $E_{3k}$, $E_{3k+1}$, $E_{3k+2}$ applied to the buffer stores $r$0, $r_1$, $r_2$ are converted by these stores into series of samples $E'_{3k}$, $E'_{3k+1}$ and $E'_{3k+2}$. The series of samples $E'_{3k}$ has the same spectrum and the same phase characteristics as the series $E_{3k}$ and the spectrum thereof is given by the expressions of table I in FIG. 11. The series of samples $E'_{3k+1}$ is shifted over the time $-T$ relative to the series $E_{3k}$ which means that the coefficients in table II of FIG. 11 must be multiplied by a factor $\exp(j2\pi fT)$ which is dependent of the frequency $f$. The buffer store $r_1$ thus has a linear phase characteristic which can be mathematically represented by $\phi_1 = 2\pi fT$ and which is shown in FIG. 12. In a corresponding manner the series of samples $E'_{3k+2}$ is shifted over a time $-2T$ relative to the series $E'_{3k}$ which means that the coefficients in table III of FIG. 11 must be multiplied by a factor $\exp(j2\pi f2T)$. The buffer store $f_2$ thus has a linear phase characteristic which can be mathematically represented by $\phi_2 = 2\pi f.2T$ and which is likewise shown in FIG. 12.

Due to the calculation section A0 to which the signals $E'_{3k}$ are applied and which as already stated can be formed as a simple delay circuit no additional phase shift in the spectrum of the series of samples $E_{3k}$ is to be introduced.

Figure 13:
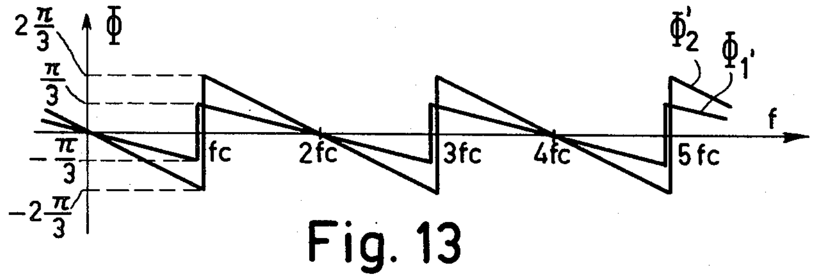

Mathematically it can be shown that the calculation of the code words $\rho_1$ which are given by the expression (12) and which are determined by the calculation section $A_1$ can be interpreted as a phase shift of the spectrum components of the signal $E'_{3k+1}$ corresponding to a phase characteristic of the shape as is shown by the curve $\phi'_1$ in FIG. 13. This sawtooth curve has a period $2f_c$ and a slope which in absolute value is equal to the slope of the curve $\phi_1$ in FIG. 12, however, with opposite sign.

Figure 14:
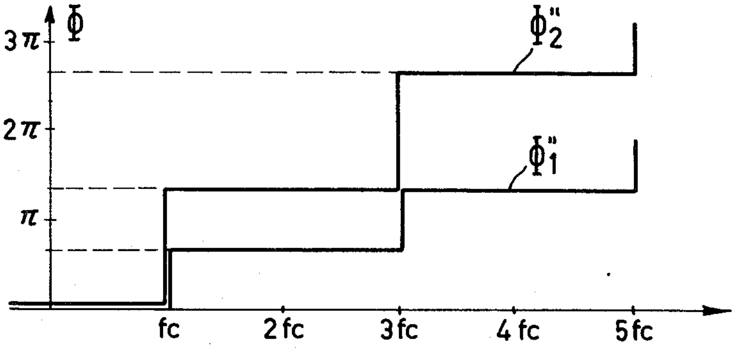

By adding the ordinates of the curves $\phi_1$ (FIG. 12) and $\phi'_1$(FIG. 13) the curve $\phi''_1$ of FIG. 14 is produced which thus shows the joint phase shift introduced by the store $r_1$ and the calculation section $A_1$ in the series $E_{3K+1}$ at the output $d_1$ of the demultiplexer 22. This phase shift is zero for frequencies located in the band of $0 - f_c$, equal to $2\pi/3$ for frequencies located in the band of from $f_c$ to $3f_c$ and equal to $4\pi/3$ for frequencies located in the band of from $3f_c$ to $5f_c$. Mathematically it can also be shown that the calculation section $A_2$ introduces a phase shift in accordance with the phase characteristic $\phi'_2$ of FIG. 13 which has a variation corresponding to the characteristic $\phi'_1$.

By also adding the ordinates of the curves $\phi_2$ and $\phi'_2$ the curve $\phi''_2$ of FIG. 14 is obtained which indicates the general phase shift which is jointly introduced by the store $r_2$ and the calculation section $A_2$. This FIG. 14 shows that the phase shift $\phi''_4$ has the value of zero for frequencies located in the band of from 0 to $f_c$, the value $4\pi/3$ for frequencies located in the band of from $f_c$ to $3f_c$ and the value $8\pi/3$ for frequencies located in the band of from $3f_c$ to $5f_c$.

Figure 15:
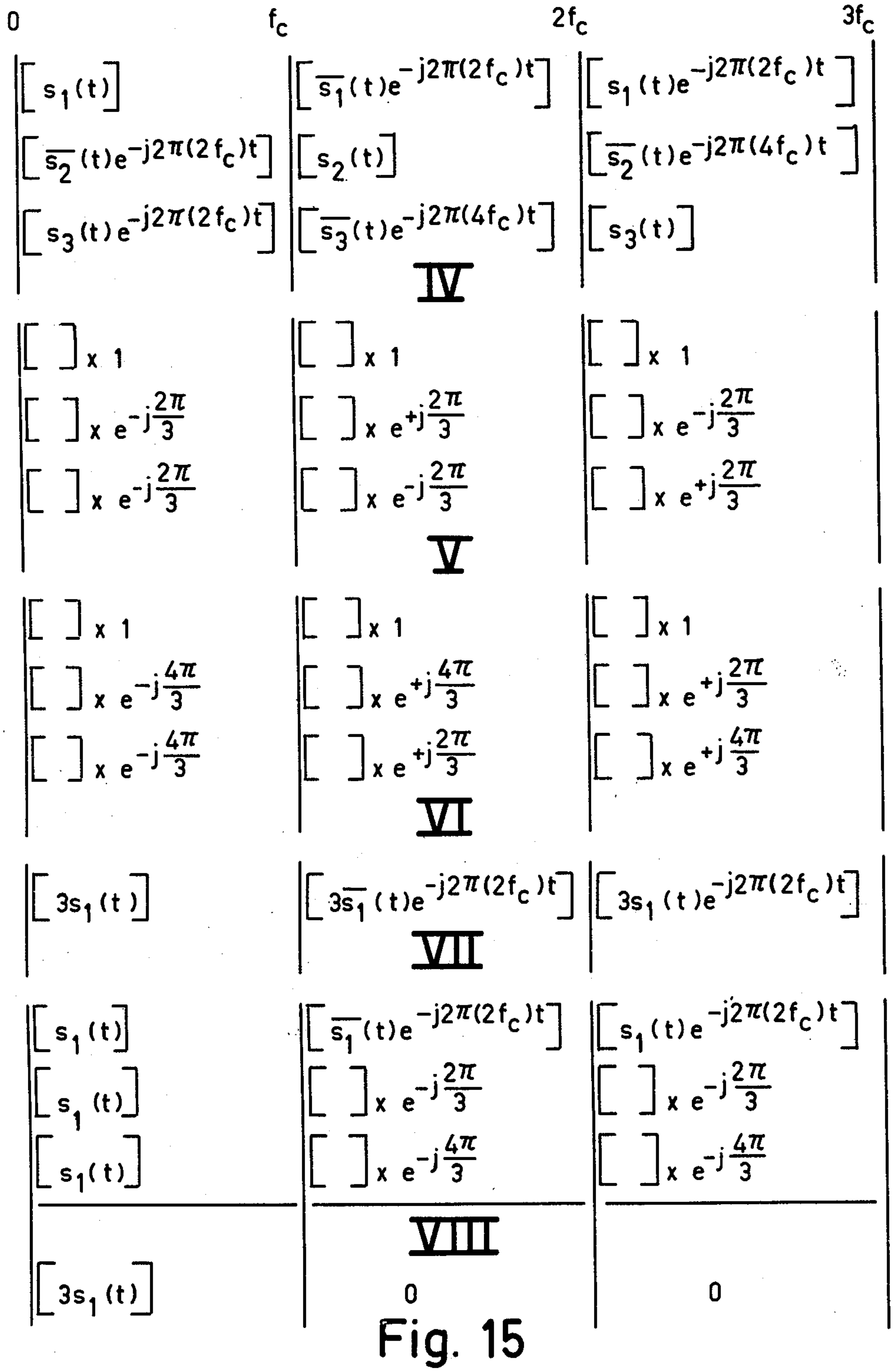
FIG. 15 shows in a table the mathematical expressions of the signals at the output of the first and the second digital filter sections.

By using the curves of FIG. 14 the signals which are applied to the adder circuit 23 can mathematically represented by the expressions shown in the tables IV, V and VI of FIG. 15. More particularly table IV shows the signals at the output of the calculation circuit Ao. It is a simple reproduction of table I because the phase have not changed. Table V shows the factors by which the signals of table IV have been multiplied to obtain the signals at the output of the calculation circuit $A_1$. In conformity with the curve $\phi''_1$ (FIG. 14) the first column of table V is identical to the first column of table II (signals in the band of from 0 to $f_c$) and the signals in the columns 2 and 3 of table V are produced by additional multiplication of the signals in the columns 2 and 3 of table II (signals in the band of from $f_c$ to $3f_c$) by a factor of $\exp(j2\pi/3)$.

Table VI shows the factors by which the signals of table IV must be multiplied to obtain the signals at the output of the calculation circuit $A_2$. In conformity with the curve $\phi''_2$ (FIG. 14) the first column of table VI is identical to the first column of table III (signals in the band of from 0 to $f_c$) and the singals in the columns 2 and 3 of table VI are produced by additional multiplication of the signals in the columns 2 and 3 of table III (signals in the band of from $f_c$ to $3f_c$) by a factor of $\exp(j4\pi/3)$.

The addition of the output numbers of the calculation sections Ao, $A_1$, $A_2$ in the adder circuit 23 can be interpreted as the addition of the signals shown in the tables IV, V and VI. The result of this addition is shown in table VII of FIG. 15. This table VII shows that the signal $s_1(t)$ occurs at the output of the adder circuit 23 and that the signals $s_2(t)$ and $s_3(t)$ are eliminated. The output signal $s_1(t)$ of the adder 23 is not only located in the frequency band of from 0 to $f_c$ but is repeated around the carrier frequency of $2f_c$. This means that the signal $s_1(t)$ sampled with a frequency of $2f_c$ occurs at the output of the first digital filter section 10. This shows that calculation sections Ao, $A_1$, . . . , $A_{N-1}$ can exclusively be formed as digital phase shifting networks which networks then have the phase characteristic according to FIG. 13 and an all-pass characteristic.

Figure 16:
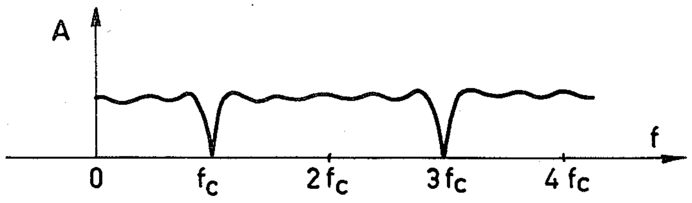
FIG. 16 shows the amplitude-versus-frequency characteristic of a non-recursive digital phase shifter and FIG. 17 shows the phase-versus-frequency characteristic of a recursive digital phase shifter.

Since no complete all-pass characteristic can be realized with digital phase shifting networks of the non-recursive type the output signals from such networks exhibit an amplitude distortion which is a function of the duration of the pulse response. FIG. 16 shows a characteristic amplitude-versus-frequency characteristic of a non-recursive phase shifting network. This characteristic is zero in case of the odd multiples of the frequency $f_c$.

A pure all-pass network can be obtained by using phase shifting networks of the recursive type. Such known networks are preferably built up from a cascade circuit of second order networks. The structure of a second order phase shifting network can be written with the aid of the Z transformation as:

$$H(Z) = \frac{Lo + L_1 Z^{-1} + L_2 Z^{-2}}{L_2 + L_1 Z^{-1} + Lo Z^{-2}}$$

Here $Lo$, $L_1$, $L_2$ represent coefficients which are independent of the variable $Z$. A recursive phase shifting network defined in this manner may be realized in known manner for example as described in the said book by Radar and Gold.

Figure 17:
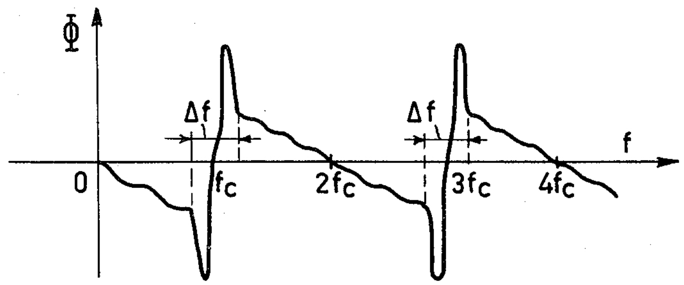

Unlike non-recursive phase shifting networks, recursive phase shifting networks have an amplitude-versus-frequency characteristic of the all-pass network but their phase-versus-frequency characteristic cannot be obtained accurately in conformity with the characteristic shown in FIG. 13. FIG. 17 shows more particularly a characteristic shape of the sawtooth phase-versus-frequency characteristic of a recursive phase shifting network. It shows that outside the frequency ranges $\Delta f$ which are located about the odd multiples of the frequency $f_c$ the phase-versus-frequency characteristic of the recursive phase shifting network corresponds approximately to the desired sawtooth curve while within the frequency ranges $\Delta f$ the deviations relative to the desired characteristic are very large.

Thus in the first digital filter section 10 the calculation sections Ao, $A_1 \ldots A_{N-1}$ can be formed as recursive phase shifting networks when they are used in the frequency bands where they approximate the desired phase-versus-frequency characteristic satisfactorily (that is to say, in the frequency ranges outside the (above mentioned) ranges $\Delta f$) particularly when the analog signal to be filtered does not have a component within these frequency ranges $\Delta f$. In the case where the signal to be filtered also comprises frequency components within the band $\Delta f$ it is necessary to eliminate these components for example by means of a comb filter so that phase and amplitude distortions can be reduced to a minimum.

Also for the interpolating filter 11 of FIG. 7 the operation can be described in an analogous manner as for the first digital filter section 10.

Here too there applies that the signal at the input of the calculation sections Bo, $B_1$, $B_2$ and located in the band $(0 - 3f_c)$ is given by the expressions of the table VI of FIG. 15. The section Bo has the rule of a delay network which does not have any influence on the phase of the signal. The sections $B_1$ and $B_2$ are phase shifting networks having phase characteristics which are equal to the characteristics $\phi'_1$ and $\phi'_2$ of FIG. 13.

The store Ro does not have any influence on the phase of the signal while the stores $R_1$ and $R_2$ each introduce a phase shift in accordance with the curves $\phi_1$ and $\phi_2$ of FIG. 12. The output signal thus obtained from the store Ro is mathematically represented by the expressions of the first line of the table VIII of FIG. 15. The output signal from the stores $R_1$ and $R_2$ which have undergone phase variations in accordance with the curves $\phi''_1$ and $\phi''_2$ of FIG. 14 are given in a mathematical form by the lines 2 and 3 of table VIII.

The operation of the multiplexer 24 can be interpreted as the addition per column of the signals which are mathematically shown in the columns of table VIII. This table VIII shows that the signal $s_1(t)$ of the signal to be filtered is obtained at the output of the interpolating filter in the band $0 - f_c$.

This interpretation shows that also for the interpolating digital filter the calculation sections Bo, $B_1 \ldots B_{N-1}$ can be formed as digital phase shifting networks and this in the form of a non-recursive network as well as in the form of a recursive network with the above mentioned phase and amplitude characteristics.

Figures 18, 19, 20, 22:
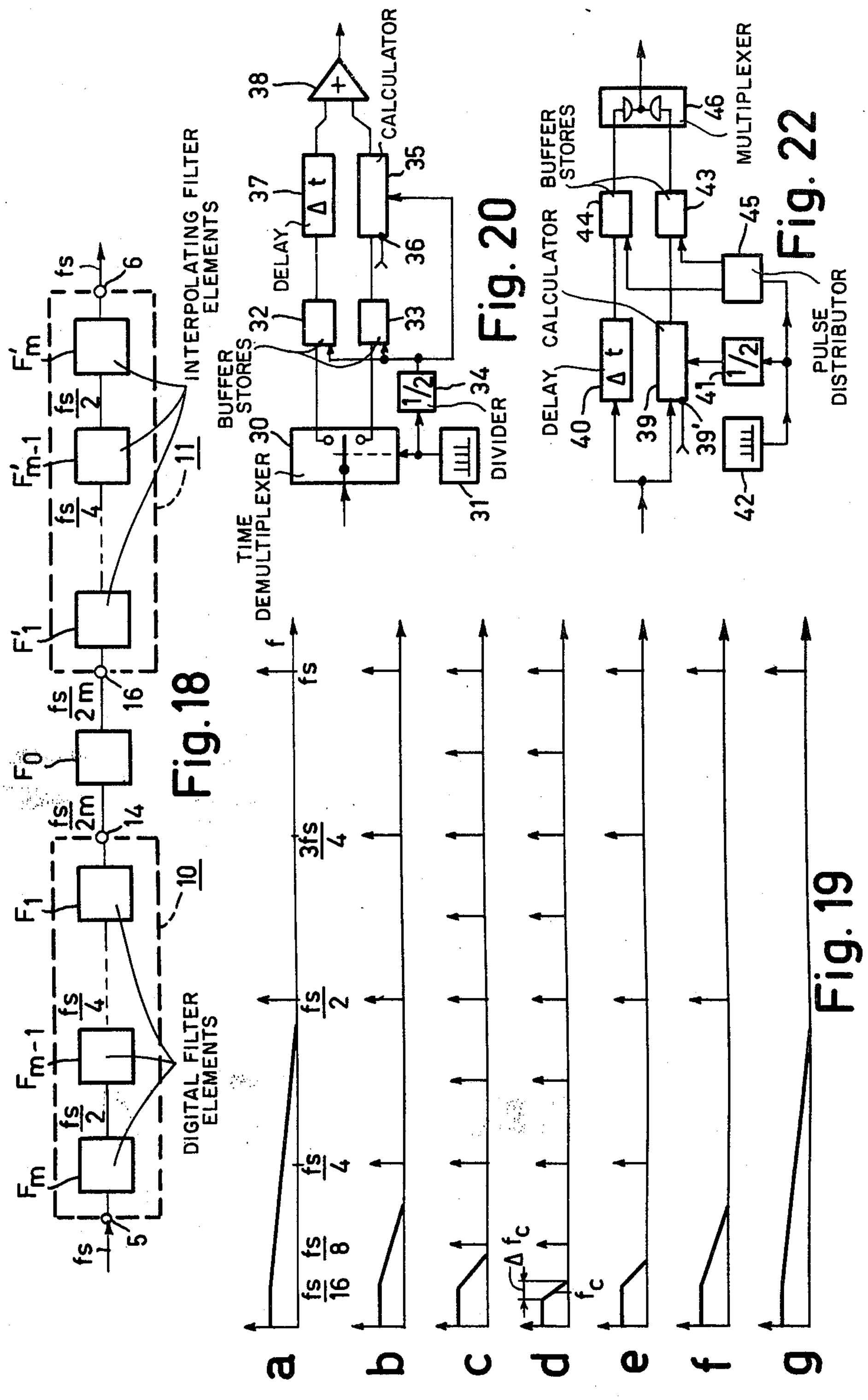
FIG. 18 shows a further embodiment of the filter according to the invention.
FIG. 19 shows the transfer function of a filter cell in the first and second digital filter sections according to FIG. 18 and FIGS. 20 and 22 show embodiments of a filter cell in the first and second digital filter sections of the filter according to FIG. 18

FIG. 18 shows a further embodiment of the filter according to the invention. This embodiment makes it possible to further reduce the number of multiplications to be performed per second and reduce the number of coefficient stores while also the use of adder circuits having more than two inputs is no longer necessary.

To describe its structure it is practical to write the ratio between the sampling frequency $f_s = 1/T$ at the input of the filter and twice the cut-off frequency $f_c$ of this filter in the form of:

$$\frac{f_s}{2f_c} = 2^m \cdot k \quad (14)$$

where $m$ is an integer and $k$ is less than 2.

In the embodiment shown in FIG. 18 where the frequency $f'_s$ of the numbers at the output of the filter is equal to the frequency $f_s$ with which the numbers occur at the input of the filter the first digital filter section 10 is built up of a cascade circuit of m filter elements $F_m$, $F_{m-1} \ldots F_1$ where each filter element is built up as a digital filter having a cut-off frequency which is equal to one-quarter of the frequency of the numbers at its input and which each supply numbers having a sampling frequency equal to half the sampling frequency of the numbers at the input of the relevant filter element so that the numbers with a sampling frequency $f_o = f_s/2^m$ occur at the output of the first digital filter section. The interpolating digital filter 11 is also built up of m interpolation elements $F'_1, \ldots, F'_m$ which are arranged in cascade and which are also each built up as a digital filter having a cut-off frequency equal to half the frequency of the numbers at the input of the relevant interpolation element and each supplying numbers having a sampling frequency which is equal to twice the sampling frequency with which the numbers occur at its input so that the numbers with a frequency $f'_s = 1/T$ occur at the output of the interpolating digital filter.

When the frequency $f'_s$ which is desired at the output 6 of the filter is different from the frequency $f_s$ at the input in such a way that $f_s'/2f_c$ is equal to $2^{m'}$ $k$, the interpolating filter 11 comprises $m'$ interpolation elements. To simplify the description the case is considered where $f_s = f'_s$.

FIG. 19 diagrammatically shows the transfer characteristics of the filter elements $F_i$ and $F'_i$ for the case where $m = 3$. Here however the baseband functions are shown but these functions are to be repeated to the multiples of the sampling frequencies which are shown by arrows in the Figure.

The diagrams 19$a$, 19$b$, 19$c$ show the transfer functions of the filter elements $F_3$, $F_2$, $F_1$ with the respective cut-off frequencies of $f_s/4$, $f_s/8$, $f_s/16$. The diagrams 19$e$, 19$f$, 19$g$ show the transfer functions of the interpolation elements $F'_1$, $F'_2$, $F'_3$ with the respective cut-off frequencies of $f_s/16$, $f_s/8$, $f_s/4$. The filter slopes are preferably the same for all filter elements and interpolation elements.

The advantages of the structure of the filter of FIG. 18 in which the variation of the sampling frequency is effected in stages by a factor of 2 emanate from the special properties and from the simple construction of these elements. More particularly each filter element for example $F_m$ may be built up in an analogous manner as the first digital filter section 10 of FIG. 1 or 7 in which the ratio N between half the sampling frequency at the input $f_s/2$ and the cut-off frequency $f_s/4$ assumes the value 2. Likewise each interpolation element such as $F'_m$ may be built up in an analogous manner as the interpolation digital filter 11 where the ratio $N$ between half the sampling frequency $f_s/2$ at the output and the cut-off frequency $f_s/4$ assumes the value of 2.

FIG. 20 shows an embodiment of a filter element of FIG. 18, namely of the non-recursive type. For the sake of clarity this element is considered as the filter element $F_m$ with a cut-off frequency of $1/4T$ to which numbers of the frequency $f_s = 1/T$ are applied and which supplies numbers at the frequency $1/2T$.

Figure 21:
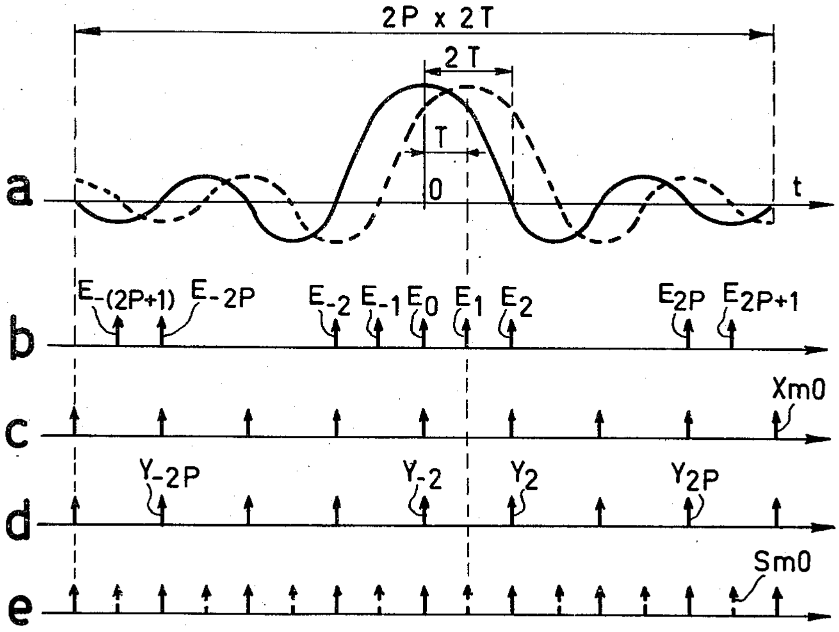
FIG. 21 shows the operation of these cells by way of time diagrams.

FIG. 21$a$ shows the pulse response of this filter element symmetrically limited in a time interval $2P.2T$. FIG. 21$b$ shows the series of samples located in this time interval which are applied to this filter element. A separation can be made between the even samples $E_{-2P}, \ldots$ Eo, $E_{+2P}$ and the odd samples $E_{-(2P+1)}, \ldots E_{-1}.E_1 \ldots E_{(2P+1)}$. The Figure shows that to determine the weighted sum of all samples falling within the duration of the pulse response with the filter coefficients given by the values of the pulse response it is only necessary to calculate this weighted sum for the odd samples because all coefficients corresponding to the even samples are zero with the exception of the coefficient Eo which is equal to 1. This weighted sum can thus be written as:

$$X_{mo} = E_o + \sum_{p=O}^{p} a_{2p+1} \left[ E_{2p+1} + E_{-(2p-1)} \right] \qquad (15)$$

where $a_{2p+1}$ indicates the odd coefficients which have the same value on either side of the coefficient $E$o.

By using such a filter element (a so-called half-band-pass filter) the number of multiplications per second and the number of required coefficients is thus reduced by 50 percent.

As is shown in FIG. 20 a filter element of this kind has a time demultiplexer 30 at its input which is symbolically shown as a two-position switch and which is controlled by the output pulses from a generator 31 occurring at a frequency $1/T$. Two series of numbers occur at the two outputs of the demultiplexer which numbers correspond to the even samples $E_{2p}$ and the odd samples $E_{2p+1}$. The two series of numbers which are mentioned for the sake of simplicity $E_{2p}$ for the even samples and $E_{2p+1}$ for the odd samples are mutually shifted in time over an interval T. They are applied to the two buffer stores 32 and 33 which are simultaneously read with a frequency of $1/2T$. This frequency $1/2T$ is derived from a two-to-one divider 34 controlled by the generator 31. Thus a series of even numbers and a series of odd numbers occurring at the frequency $1/2T$ is obtained at the outputs of the stores 32 and 33. The odd numbers are applied to the calculation circuit 35 to which also the filter coefficients $a_{2p+1}$ are applied through an input 36 from a store not shown. For each control pulse supplied by the divider 34 the calculator 35 provides a weighted sum in accordance with expression (15). The even numbers (such as $E$o) are delayed in the delay circuit 37 (which may alternatively be a calculation circuit equal to 35) so that they correspond in time with the corresponding weighted sum supplied by the calculation circuit 35. The outgoing numbers from the circuits 35 and 37 occurring at a frequency of $1/2T$ are added in the adder circuit 38. The different samples are shown in FIG. 21$c$ in the position they have relative to the input samples of FIG. 21$b$.

The other filter elements $F_{m-1} \ldots F_1$ of FIG. 18 have exactly the same structure as those of FIG. 20; they are distinguished mutually in frequency from the pulse generator 31 which is equal to the frequency of the numbers at the input of the filter elements and in the values of the filter coefficients which are applied to the calculation circuit 35.

The structure of an interpolation element $F'_1 \ldots F'_{m-1}, F'_m$ which uses a non-recursive calculation circuit is shown in FIG. 22. Here it is assumed that the element $F'_m$ is shown to which numbers of the frequency $1/2T$ are applied and has a cut-off frequency of $1/4T$ and is adapted for generating the numbers with a frequency $f'_s = 1/T$.

The pulse response of this filter $F'_m$ of the cut-off frequency $1/4T$ has also a form as is shown in FIG. 21$a$. FIG. 21$d$ shows a limited series of $2P$ numbers at the input of the interpolation element. To indicate the coefficients which are utilized to calculate the weighted sum of the numbers $Y_{-2P} \ldots Y_{-2}, Y_2 \ldots Y_{2P}$ the pulse response of the broken line curve of FIG. 21$a$ is shifted over a time $+T$ relative to the solid line curve.

The numbers applied with a frequency of $1/2T$ to the interpolation element of FIG. 22 are applied to the calculation circuit 39 and to the delay circuit 40. For each control pulse occurring at the frequency $1/2T$ which is derived by a two-to-one divider 41 from the output pulses from the generator 42 occurring at a frequency of $1/T$ the calculation circuit 39 provides a number in accordance with the expression:

$$Smo = \sum_{p=1}^{p} a_2p \left[ Y_{2p} + Y_{-2p} \right] \qquad (16)$$

where $a_{2p}$ represents the values of the pulse response in the broken line curve of FIG. 21$a$ at the instants when the numbers $Y_{2p}$ and $Y_{-2p}$ of FIG. 21$d$ occur. These coefficients are applied to the terminal 39' of the calculation circuit 39. Each number Smo is the interpolated value in the centre between two successive numbers $Y_{-2}$ and $Y_2$.

In the delay circuit 40 the numbers applied to the interpolation element are delayed in such a manner that they correspond in time with the weighted sum supplied by the calculation circuit 39.

The numbers at the outputs of the calculation circuit 39 and the delay circuit 40 are applied to the buffer stores 43, 44 which are read successively with a mutual time shift of T at the frequency $1/2T$. These read signals are supplied by the pulse distributor 45. The two series of numbers thus obtained are mixed in the multiplexer 46 which provides a series of output numbers of the interpolation element at a frequency of $1/T$. FIG. 21*e* shows this series where the interpolated numbers are denoted by broken lines and the numbers corresponding to the delayed input numbers are denoted by the solid lines.

It is evident that the interpolation element has the same properties as the filter elements of the first filter section 10 as regards the number of multiplications per second and the number of required coefficient stores.

As can be proved mathematically the number of multiplications $M_5$ which is to be performed per second in the filter of FIG. 18 with calculation circuits of the non-recursive type is still smaller than in the embodiments of FIGS. 1 and 7. This reduction is illustrated in FIG. 6 by means of the curve $M_5$.T. Also in this case this curve shows the number of multiplications which is necessary for calculating one output code word, in this case the ratio $N = f_s/2f_c$. As compared with the curve $M_4$.T a considerable reduction in the number of multiplications is found.

Likewise as in the embodiment of FIG. 7 the calculation circuits 35 and 43 of the recursive type may be used.

Figure 23:
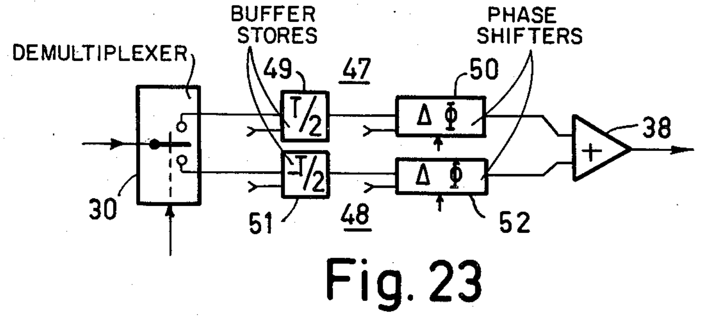

A filter element $F_m$ formed in this manner is shown in FIG. 23. To simplify this Figure the control circuits for the buffer stores and the calculation circuits are not shown. Two branches 47 and 48 are incorporated between the outputs of the demultiplexer 30 and the adder circuit 38 which are formed in the same manner as in FIG. 20 and in which the demultiplexer is controlled by a frequency $1/T$. The branch 37 comprises the buffer store 49 and the digital phase shifting network 50 whose phase-versus-frequency characteristics are denoted by 49 and 50 in FIG. 24*a*. The characteristic of the store 49 has a positive slope equal to $\pi T$ which means the the store that produces a time shift of $+ T/2$ on the incoming numbers. The characteristic of the digital phase shifting network 50 approximates the theoretical sawtooth curve of FIG. 24*a* which has a period of $1/2T$ and a slope which is equal but of opposite sign to that of the straight line 49. The branch 48 comprises a buffer store 51 and a recursive digital phase shifting network 52 whose phase-versus-frequency characteristics are denoted by 51 and 52 in FIG. 24*b*. The characteristic of the store 51 has a negative slope equal to $-\pi T$ which means that the store 51 produces a time shift of $- T/2$ (in practice $T/2 + T$) of the incoming numbers. The characteristic of the phase shifting network 52 is the sawtooth curve in FIG. 24*b* which has a slope which is equal but of opposite sign the the slope of the straight line 51.

Figure 24:
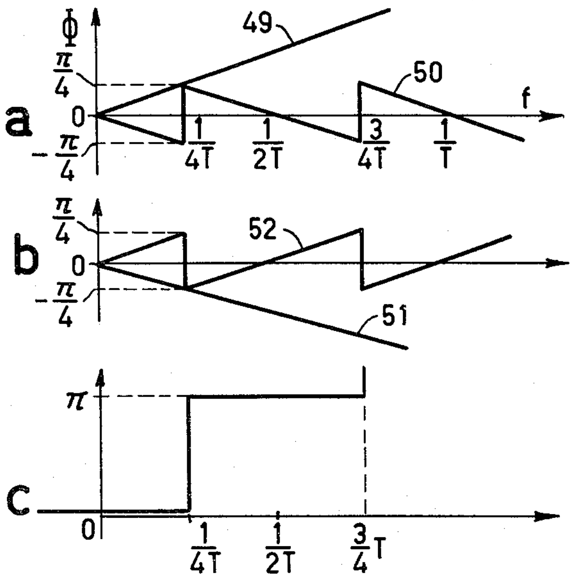
FIGS. 23 and 25 show the modifications of the filter cells according to FIGS. 20 and 22 and FIG. 24 shows the operation of these cells by way of phase-versus-frequency characteristics.

The numbers occur simultaneously at the output of the phase shifting networks 50 and 52 and are applied with a frequency $1/2T$ to the adder circuit 38. The phase characteristic of the filter element formed in this manner is obtained by subtracting the ordinates of the curves 49, 50 (FIG. 24*a*) from the ordinates of the curves 51 and 52 (FIG. 24*b*). This phase characteristic is shown in FIG. 24*c*. The result is a steplike curve from which it is found that the considered circuit arrangements do not introduce any phase shift for the spectral components in the band of $0 - 1/4T$ and introduce a phase shift which increases in value of from $\pi$ with steps of $\pi$ in successive frequency bands having a width of $1/2T$ and located about multiples of the sampling frequency $1/2T$.

Figure 25:
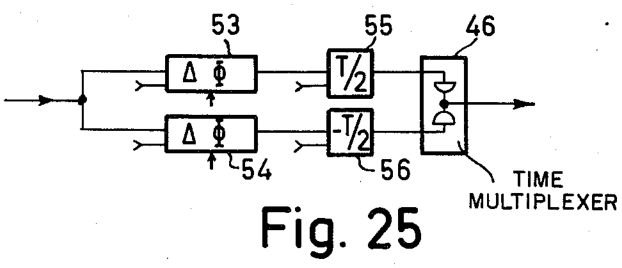

An interpolation element which uses recursive phase shifting networks is shown in FIG. 25. Its structure can be easily derived from that of the interpolating digital filter 11 of FIG. 7 (the case where $N = 2$). The phase-versus-frequency characteristics of these networks are the same as for the phase shifting networks of the filter elements which are built up in accordance with FIG. 23 and are therefore also shown by the FIGS. 24*a* and 24*b*. More particularly FIG. 25 shows the interpolation element $F'_m$ to which numbers are applied at a frequency of $1/2T$ and which are applied to two digital phase shifting networks 53 and 54. The outputs of these phase shifting networks are each connected to the input of the buffer store 55 or 56 in which the store 55 shifts the numbers over a time $T/2$ and the store 56 shifts the numbers over a time $T/2 + T$ (which is equal to $- T/2$). The series of numbers supplied by the stores 55, 56 are applied to the time multiplexer 46 at its outputs supplying these numbers with frequency of $1/T$.

With the aid of transposition means the lowpass filter according to the invention can be converted into a highpass filter or in a bandpass filter with the same properties.

It is to be noted that if the base bandwidth of the output signal of the first digital filter section 10 is larger than the desired bandwidth $f_c$, an additional filter with a cut-off frequency of $f_c$ (see filter 25 in FIG. 1 and filter $F_o$ in FIG. 18) can be placed between the first digital filter section 10 and the interpolating digital filter 11, which filter may also be of either the recursive or the non-recursive type.

For completeness' sake the tables A and B below show a comparison between the number of multiplications to be performed for calculating one output code word of the filter as a function of the ratio $N = f_s/2f_c$ for different types of filters. In this case it is assumed that the slope of all filters is the same namely $\Delta f_{c/fc} = 0.1$. More particularly table A shows the number of multiplications to be performed and table B shows the number of storage networks required.

Table A shows inter alia that the number of multiplications with the filter according to the invention decreases when N increases while this number remains constant in case of a recursive filter. In that respect the filter according to the invention is more advantageous than a recursive filter for a sampling frequency $f_s$ which is not much higher than twice the cut-off frequency $f_c$. Table B shows that the number of storage networks in the filter according to the invention is much smaller than in the known filters of the recursive type.

| $N = \frac{f_s}{2f_c}$ | direct convolution | recursive filter | rapid convolution | frequency sampling | filter according to FIG. 18 with $F_o$ as a non-recursive filter | filter according to FIG. 18 with $F_o$ as a recursive filter |
|---|---|---|---|---|---|---|
| 2 | 45 | 15 | 21 | 65 | 23 | 15 |
| 3 | 65 | 15 | 21 | 65 | 19 | 10 |
| 5 | 110 | 15 | 24 | 65 | 12 | 8 |
| 10 | 220 | 15 | 27 | 60 | 8 | 6 |
| 2 | 90 | 7 | 256 | 160 | 88 | 7 |
| 3 | 130 | 7 | 256 | 210 | 80 | 26 |
| 5 | 220 | 7 | 512 | 310 | 95 | 49 |
| 10 | 440 | 7 | 1024 | 550 | 105 | 59 |

What is claimed is:

1. A digital filter for filtering a series of first binary code words occuring at a first sampling frequency $f_s$, and for producing a filtered version of the first words occuring at another sampling frequency $f'_s$, comprising: at least one first digital filter subunit having an input terminal, an output terminal and a first cut-off frequency which is smaller than $f_s$; means to apply said series of first words to the input terminal of the first filter subunit, at least one interpolation digital filter subunit having an input terminal, an output terminal and a second cut-off frequency which is smaller than $f'_s$; each subunit including a source of filter coefficients, means for providing a weighted sum of a predetermined series of words with a corresponding series of the filter coefficients, and a clock pulse generator; the pulse generator in the first subunit operating at a frequency which exceeds the first cut-off frequency to provide at the output terminal of the first subunit a series of second code words occuring at a sampling frequency exceeding said first cut-off frequency and constituting a version of said first words; means to apply said second code words to the input terminal of said interpolation filter subunit; and the pulse generator in the interpolation filter subunit operating at the desired sampling frequency $f'_s$.

2. A digital filter as claimed in claim 1, wherein an auxiliary bandwidth limiting filter having a cut-off frequency $f_c$ is incorporated between the output terminal of the first digital filter subunit and the input terminal of the interpolating digital filter subunit.

* * * * *